(12) United States Patent
Isa et al.

(10) Patent No.: US 9,356,152 B2
(45) Date of Patent: May 31, 2016

(54) SEMICONDUCTOR DEVICE, ELECTRONIC DEVICE, AND METHOD OF MANUFACTURING SEMICONDUCTOR DEVICE

(71) Applicant: Semiconductor Energy Laboratory Co., Ltd., Kanagawa-ken (JP)

(72) Inventors: Toshiyuki Isa, Kanagawa (JP); Masafumi Morisue, Kanagawa (JP); Ikuko Kawamata, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/164,476

(22) Filed: Jan. 27, 2014

(65) Prior Publication Data

US 2014/0138680 A1   May 22, 2014

Related U.S. Application Data

(60) Division of application No. 13/241,577, filed on Sep. 23, 2011, now Pat. No. 8,648,346, which is a continuation of application No. 12/464,252, filed on May 12, 2009, now Pat. No. 8,487,436, which is a division of application No. 11/333,646, filed on Jan. 17, 2006, now Pat. No. 7,608,531.

(30) Foreign Application Priority Data

Jan. 28, 2005   (JP) .................................. 2005-022248

(51) Int. Cl.
*H01L 29/12*   (2006.01)
*H01L 29/786*   (2006.01)
(Continued)

(52) U.S. Cl.
CPC .......... *H01L 29/7869* (2013.01); *H01L 27/124* (2013.01); *H01L 27/1285* (2013.01); *H01L 27/1292* (2013.01); *H01L 51/0022* (2013.01); *H01L 2924/0002* (2013.01)

(58) Field of Classification Search
CPC ............ H01L 29/7869; H01L 27/1225; H01L 27/124; H01L 33/42; H01L 27/1251; H01L 27/3248; H01L 29/458; H01L 21/02472; H01L 21/02483; H01L 29/78678; H01L 27/1292; H01L 51/0004; H01L 29/41725
USPC .......................................................... 257/43
See application file for complete search history.

(56) References Cited

U.S. PATENT DOCUMENTS

| | | |
|---|---|---|
| 5,612,565 A | 3/1997 | Kusumoto |
| 5,731,856 A | 3/1998 | Kim et al. |

(Continued)

FOREIGN PATENT DOCUMENTS

| | | |
|---|---|---|
| CN | 1272298 A | 11/2000 |
| CN | 1282106 A | 1/2001 |

(Continued)

OTHER PUBLICATIONS

Korean Office Action re Application No. KR 2012-0148238, dated Jun. 18, 2014.

(Continued)

*Primary Examiner* — Thien F Tran
(74) *Attorney, Agent, or Firm* — Husch Blackwell LLP

(57) ABSTRACT

To provide a semiconductor device and a display device which can be manufactured through a simplified process and the manufacturing technique. Another object is to provide a technique by which a pattern of wirings or the like which is partially constitutes a semiconductor device or a display device can be formed with a desired shape with controllability.

34 Claims, 16 Drawing Sheets

(51) Int. Cl.
   *H01L 51/00* (2006.01)
   *H01L 27/12* (2006.01)

(56) References Cited

U.S. PATENT DOCUMENTS

| | | | |
|---|---|---|---|
| 5,744,824 A | 4/1998 | Kousai et al. | |
| 5,744,864 A | 4/1998 | Cillessen et al. | |
| 5,753,942 A | 5/1998 | Seok | |
| 6,020,598 A | 2/2000 | Yamazaki | |
| 6,040,609 A | 3/2000 | Frisina et al. | |
| 6,060,747 A | 5/2000 | Okumura et al. | |
| 6,294,274 B1 | 9/2001 | Kawazoe et al. | |
| 6,344,379 B1 | 2/2002 | Venkatraman et al. | |
| 6,365,470 B1 | 4/2002 | Maeda | |
| 6,407,782 B1* | 6/2002 | Kim | 349/106 |
| 6,456,013 B1 | 9/2002 | Komiya et al. | |
| 6,504,244 B2 | 1/2003 | Ichinose et al. | |
| 6,518,594 B1 | 2/2003 | Nakajima et al. | |
| 6,563,174 B2 | 5/2003 | Kawasaki et al. | |
| 6,627,957 B1 | 9/2003 | Yamazaki | |
| 6,651,281 B1 | 11/2003 | Figiel | |
| 6,680,772 B2 | 1/2004 | Lee | |
| 6,697,141 B2 | 2/2004 | Yamakita et al. | |
| 6,710,835 B2 | 3/2004 | Kurahashi et al. | |
| 6,715,871 B2 | 4/2004 | Hashimoto et al. | |
| 6,727,522 B1 | 4/2004 | Kawasaki et al. | |
| 6,762,816 B1 | 7/2004 | Yamakita et al. | |
| 6,810,814 B2 | 11/2004 | Hasei | |
| 6,815,273 B2 | 11/2004 | Nakajima et al. | |
| 6,890,050 B2 | 5/2005 | Ready et al. | |
| 6,924,863 B2 | 8/2005 | Nishida et al. | |
| 6,994,414 B2 | 2/2006 | Hashimoto et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,092,049 B2 | 8/2006 | Kadotani et al. | |
| 7,105,868 B2 | 9/2006 | Nause et al. | |
| 7,146,910 B2 | 12/2006 | Hasei | |
| 7,199,033 B2 | 4/2007 | Hirai et al. | |
| 7,205,640 B2 | 4/2007 | Yoshioka et al. | |
| 7,211,825 B2 | 5/2007 | Shih et al | |
| 7,244,962 B2 | 7/2007 | Nakajima et al. | |
| 7,282,769 B2 | 10/2007 | Van De Walle et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,368,331 B2 | 5/2008 | Hirai | |
| 7,371,598 B2 | 5/2008 | Nakamura et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,411,211 B1 | 8/2008 | Yamazaki | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,485,898 B2 | 2/2009 | Nakajima et al. | |
| 7,501,293 B2 | 3/2009 | Ito et al. | |
| 7,608,531 B2 | 10/2009 | Isa et al. | |
| 7,626,202 B2 | 12/2009 | Yamazaki | |
| 7,674,650 B2 | 3/2010 | Akimoto et al. | |
| 7,732,819 B2 | 6/2010 | Akimoto et al. | |
| 7,795,730 B2 | 9/2010 | Nakamura et al. | |
| 7,956,359 B2 | 6/2011 | Yamazaki | |
| 8,003,989 B2 | 8/2011 | Nakajima et al. | |
| 8,023,055 B2 | 9/2011 | Nakajima et al. | |
| 8,487,436 B2 | 7/2013 | Isa et al. | |
| 8,648,346 B2 | 2/2014 | Isa et al. | |
| 8,654,270 B2 | 2/2014 | Nakajima et al. | |
| 2001/0046027 A1 | 11/2001 | Tai et al. | |
| 2002/0024626 A1 | 2/2002 | Lee et al. | |
| 2002/0056838 A1 | 5/2002 | Ogawa | |
| 2002/0090774 A1 | 7/2002 | Oda et al. | |
| 2002/0131005 A1 | 9/2002 | Yang | |
| 2002/0132454 A1 | 9/2002 | Ohtsu et al. | |
| 2003/0083203 A1 | 5/2003 | Hashimoto et al. | |
| 2003/0189401 A1 | 10/2003 | Kido et al. | |
| 2003/0218222 A1 | 11/2003 | Wager et al. | |
| 2003/0232128 A1 | 12/2003 | Furusawa et al. | |
| 2004/0004215 A1 | 1/2004 | Iechi et al. | |
| 2004/0038446 A1 | 2/2004 | Takeda et al. | |
| 2004/0042296 A1 | 3/2004 | Tempel | |
| 2004/0127038 A1 | 7/2004 | Carcia et al. | |
| 2004/0129978 A1 | 7/2004 | Hirai | |
| 2004/0164302 A1 | 8/2004 | Arai et al. | |
| 2004/0226929 A1 | 11/2004 | Miura et al. | |
| 2005/0017302 A1 | 1/2005 | Hoffman | |
| 2005/0141276 A1 | 6/2005 | Takeuchi et al. | |
| 2005/0173734 A1 | 8/2005 | Yoshioka et al. | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0102893 A1 | 5/2006 | Gerlach et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170077 A1 | 8/2006 | Aoki et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1* | 10/2006 | Kim et al. | 257/310 |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0085938 A1 | 4/2007 | Yamazaki et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |

(56) References Cited

U.S. PATENT DOCUMENTS

| | | |
|---|---|---|
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0169003 A1 | 7/2011 | Yamazaki |
| 2012/0119207 A1 | 5/2012 | Goto et al. |

FOREIGN PATENT DOCUMENTS

| | | |
|---|---|---|
| CN | 1319890 A | 10/2001 |
| CN | 1459372 A | 12/2003 |
| EP | 1 030 544 A1 | 8/2000 |
| EP | 1 122 777 A2 | 8/2001 |
| EP | 1 134 811 A1 | 9/2001 |
| EP | 1 286 578 A2 | 2/2003 |
| EP | 1 453 088 A2 | 9/2004 |
| EP | 1 737 044 A1 | 12/2006 |
| EP | 1 746 659 A2 | 1/2007 |
| EP | 2 015 624 A2 | 1/2009 |
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 5-251705 A | 9/1993 |
| JP | 06-067187 A | 3/1994 |
| JP | 7-162010 | 6/1995 |
| JP | 8-264794 A | 10/1996 |
| JP | 9-36111 | 2/1997 |
| JP | 10-144928 A | 5/1998 |
| JP | 11-505377 A | 5/1999 |
| JP | 11-207959 | 8/1999 |
| JP | 11-251259 | 9/1999 |
| JP | 11-264995 A | 9/1999 |
| JP | 2000-44236 A | 2/2000 |
| JP | 2000-150900 A | 5/2000 |
| JP | 3067949 B2 | 7/2000 |
| JP | 2001-053283 A | 2/2001 |
| JP | 2002-76356 A | 3/2002 |
| JP | 2002-100621 A | 4/2002 |
| JP | 2002-141503 A | 5/2002 |
| JP | 2002-196348 A | 7/2002 |
| JP | 2002-289859 A | 10/2002 |
| JP | 2003-46081 | 2/2003 |
| JP | 2003-59940 | 2/2003 |
| JP | 2003-80694 | 3/2003 |
| JP | 2003-84686 | 3/2003 |
| JP | 2003-86000 A | 3/2003 |
| JP | 2003-86808 A | 3/2003 |
| JP | 2003-133691 | 5/2003 |
| JP | 2003-229437 A | 8/2003 |
| JP | 2003-311196 | 11/2003 |
| JP | 2003-315813 | 11/2003 |
| JP | 2003-324266 A | 11/2003 |
| JP | 2004-927 A | 1/2004 |
| JP | 2004-103957 A | 4/2004 |
| JP | 2004-273614 A | 9/2004 |
| JP | 2004-273732 A | 9/2004 |
| JP | 2004-282050 A | 10/2004 |
| JP | 2004-335849 | 11/2004 |
| JP | 2004-349583 A | 12/2004 |
| JP | 2004-351305 | 12/2004 |
| JP | 2004-356321 | 12/2004 |
| JP | 2005-506704 A | 3/2005 |
| KR | 10-0174034 B1 | 2/1999 |
| KR | 2004-0054410 A | 6/2004 |
| KR | 10-0466963 B1 | 1/2005 |
| KR | 2005-0007419 A | 1/2005 |
| KR | 10-2005-0032999 | 4/2005 |
| KR | 2006-0087455 A | 8/2006 |
| KR | 2006-0113745 A | 11/2006 |
| KR | 2009-0118892 A | 11/2009 |
| KR | 2012-0034115 A | 4/2012 |
| TW | 468268 B | 12/2001 |
| TW | 200406850 A | 5/2004 |
| WO | WO 03/034502 A1 | 4/2003 |
| WO | WO 03/098699 A1 | 11/2003 |
| WO | WO 2004/114391 A1 | 12/2004 |
| WO | WO 2005/055178 A1 | 6/2005 |

OTHER PUBLICATIONS

Ohta, H. et al., "Transparent Oxide Optoelectronics," Materials Today, vol. 7, No. 6, Jun. 1, 2004, pp. 42-51.
Office Action re Chinese application No. CN 200610006916.3, dated Aug. 29, 2008 (with English translation).
Office Action re Chinese application No. CN 200610006916.3, dated Apr. 10, 2009 (with English translation).
Office Action re Korean application No. KR 10-2009-0095476, dated Jan. 28, 2011 (with English translation).
Office Action re Chinese application No. CN 200910205017.X, dated Jun. 20, 2012 (with full English translation).
Office Action re Chinese application No. CN 200910205017.X, dated Nov. 2, 2012 (with full English translation).
Office Action re Taiwanese Application No. 98135099, dated Apr. 10, 2013 (with English translation).
Fortunato, E. et al., "Wide-Bandgap High-Mobility ZnO Thin-Film Transistors Produced at Room Temperature," Applied Physics Letters, Sep. 27, 2004, vol. 85, No. 13, pp. 2541-2543.
Dembo, H. et al., "RFCPUS on Glass and Plastic Substrates Fabricated by TFT Transfer Technology," IEDM 05: Technical Digest of International Electron Devices Meeting, Dec. 5, 2005, pp. 1067-1069.
Ikeda, T. et al., "21.2: Full-Functional System Liquid Crystal Display Using CG-Silicon Technology," SID Digest '04: SID International Symposium Digest of Technical Papers, 2004, vol. 35, pp. 860-863.
Nomura, K. et al., "Room-Temperature Fabrication of Transparent Flexible Thin-Film Transistors Using Amorphous Oxide Semiconductors," Nature, Nov. 25, 2004, vol. 432, pp. 488-492.
Park, J. et al., "Improvements in the Device Characteristics of Amorphous Indium Gallium Zinc Oxide Thin-Film Transistors by Ar Plasma Treatment," Applied Physics Letters, Jun. 26, 2007, vol. 90, No. 26, pp. 262106-1-262106-3.
Takahashi, M. et al., "Theoretical Analysis of IGZO Transparent Amorphous Oxide Semiconductor," IDW '08: Proceedings of the 15th International Display Workshops, Dec. 3, 2008, pp. 1637-1640.
Hayashi, R. et al., "42:1: Invited Paper: Improved Amorphous In—Ga—Zn—O TFTS,", SID Digest '08 : SID International Symposium Digest of Technical Papers, May 20, 2008, vol. 39, pp. 621-624.
Prins, M. et al., "A Ferroelectric Transparent Thin-Film Transistor," Applied Physics Letters, Jun. 17, 1996, vol. 68, No. 25, pp. 3650-3652.
Nakamura, M. et al., "The Phase Relations in the In2O3—Ga2ZnO4—ZnO System at 1350° C," Journal of Solid State Chemistry, Aug. 1, 1991, vol. 93, No. 2, pp. 298-315.
Kimizuka, N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.
Nomura, K. et al., "Thin-Film Transistor Fabricated in Single-Crystalline Transparent Oxide Semiconductor," Science, May 23, 2003, vol. 300, No. 5623, pp. 1269-1272.
Masuda, et al., "Transparent Thin Film Transistors Using ZnO as an Active Channel Layer and Their Electrical Properties," Journal of Applied Physics, Feb. 1, 2003, vol. 93, No. 3, pp. 1624-1630.
Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
Osada, T. et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

(56) References Cited

OTHER PUBLICATIONS

Nomura, K. et al., "Carrier Transport in Transparent Oxide Semiconductor with Intrinsic Structural Randomness Probed Using Single-Crystalline InGaO3(ZnO)5 Films," Applied Physics Letters, Sep. 13, 2004, vol. 85, No. 11, pp. 1993-1995.

Li, C. et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son, K. et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee, J. et al., "42.2: World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari, H. et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno, H. et al., "White Stacked Electrophosphorecent Organic Light-Emitting Devices Employing MOO3 as a Charge-Generation Layer," Advanced Materials, 2006, vol. 18, No. 3, pp. 339-342.

Tsuda, K. et al., "Ultra Low Power Consumption Technologies for Mobile TFT-LCDs ," IDW '02: Proceedings of the 9th International Display Workshops, Dec. 4, 2002, pp. 295-298.

Van de Walle, C. "Hydrogen as a Cause of Doping in Zinc Oxide," Physical Review Letters, Jul. 31, 2000, vol. 85, No. 5, pp. 1012-1015.

Fung, T. et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Jeong, J. et al., "3.1: Distinguished Paper: 12.1-Inch WXGA AMOLED Display Driven by Indium—Gallium—Zinc Oxide TFTs Array," SID Digest '08: SID International Symposium Digest of Technical Papers, May 20, 2008, vol. 39, No. 1, pp. 1-4.

Park, J. et al., "High Performance Amorphous Oxide Thin Film Transistors with Self-Aligned Top-Gate Structure," IEDM 09: Technical Digest of International Electron Devices Meeting, Dec. 7, 2009, pp. 191-194.

Kurokawa, Y. et al., "UHF RFCPUS on Flexible and Glass Substrates for Secure RFID Systems," Journal of Solid-State Circuits , 2008, vol. 43, No. 1, pp. 292-299.

Ohara, H. et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates, D. et al., "Optical Studies of the Amorphous Liqid-Cholesteric Liquid Crystal Transition:The Blue Phase", Physics Letters, Sep. 10, 1973, vol. 45A, No. 2, pp. 115-116.

Cho, D. et al., "21.2: Al and Sn-Doped Zinc Indium Oxide Thin Film Transistors for AMOLED Back-Plane," SID Digest '09: SID International Symposium Digest of Technical Papers, May 31, 2009, pp. 280-283.

Lee, M. et al., "15.4:Excellent Performance of Indium—Oxide-Based Thin-Film Transistors by DC Sputtering," SID Digest '09: SID International Symposium Digest of Technical Papers, May 31, 2009, pp. 191-193.

Jin, D. et al., "65.2: Distinguished Paper:World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Sakata, J. et al., "Development of 4.0-In. AMOLED Display With Driver Circuit Using Amorphous In—Ga—Zn—Oxide TFTS," IDW '09: Proceedings of the 16th International Display Workshops, 2009, pp. 689-692.

Park, J. et al., "Amorphous Indium—Gallium—Zinc Oxide TFTS and Their Application for Large Size AMOLED," AM-FPD '08 Digest of Technical Papers, Jul. 2, 2008, pp. 275-278.

Park, S. et al., "Challenge to Future Displays: Transparent AM-OLED Driven by Peald Grown ZnO TFT," IMID '07 Digest, 2007, pp. 1249-1252.

Godo, H. et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Osada, T. et al., "Development of Driver-Integrated Panel Using Amorphous In—Ga—Zn—Oxide TFT," AM-FPD '09 Digest of Technical Papers, Jul. 1, 2009, pp. 33-36.

Hirao, T. et al., "Novel Top-Gate Zinc Oxide Thin-Film Transistors (ZnO TFTS) for AMLCDS," Journal of the SID, 2007, vol. 15, No. 1, pp. 17-22.

Hosono, H. "68.3:Invited Paper:Transparent Amorphous Oxide Semiconductors for High Performance TFT," SID Digest '07: SID International Symposium Digest of Technical Papers, 2007, vol. 38, pp. 1830-1833.

Godo, H. et al., "P-9:Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.

Ohara, H. et al., "21.3:4.0 in. QVGA AMOLED Display Using In—Ga—Zn—Oxide TFTS With a Novel Passivation Layer," SID Digest '09: SID International Symposium Digest of Technical Papers, May 31, 2009, pp. 284-287.

Miyasaka, M. "58.2: InvitedPaper: Suftla Flexible Microelectronics on Their Way to Business," SID Digest '07: SID International Symposium Digest of Technical Papers, 2007, vol. 38, pp. 1673-1676.

Chern, H. et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi, H. et al., "39.1:Invited Paper:Optically Isotropic Nano-Structured Liquid Crystal Composites for Display Applications," SID Digest '09: SID International Symposium Digest of Technical Papers, May 31, 2009, pp. 578-581.

Asaoka, Y. et al., "29.1:Polarizer-Free Reflective LCD Combined With Ultra Low-Power Driving Technology," SID Digest '09: SID International Symposium Digest of Technical Papers, May 31, 2009, pp. 395-398.

Lee, H. et al., "Current Status of, Challenges to, and Perspective View of AM-OLED ," IDW '06: Proceedings of the 13th International Display Workshops, Dec. 7, 2006, pp. 663-666.

Kikuchi, H. et al., "62.2:Invited Paper:Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Nakamura, M. "Synthesis of Homologous Compound with New Long-Period Structure," NIRIM Newsletter, Mar. 1, 1995, vol. 150, pp. 1-4.

Kikuchi, H. et al., "Polymer-Stabilized Liquid Crystal Blue Phases," Nature Materials, Sep. 2, 2002, vol. 1, pp. 64-68.

Kimizuka, N. et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.

Kitzerow, H. et al., "Observation of Blue Phases in Chiral Networks," Liquid Crystals, 1993, vol. 14, No. 3, pp. 911-916.

Costello, M. et al., "Electron Microscopy of a Cholesteric Liquid Crystal and Its Blue Phase," Physical Review. A, May 1, 1984, vol. 29, No. 5, pp. 2957-2959.

Meiboom, S. et al., "Theory of the Blue Phase of Cholesteric Liquid Crystals," Physical Review Letters, May 4, 1981, vol. 46, No. 18, pp. 1216-1219.

Park, Sang-Hee et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

(56) References Cited

OTHER PUBLICATIONS

Orita, M. et al., "Mechanism of Electrical Conductivity of Transparent InGaZnO4," Physical Review. B, Jan. 15, 2000, vol. 61, No. 3, pp. 1811-1816.

Nomura, K. et al., "Amorphous Oxide Semiconductors for High-Performance Flexible Thin-Film Transistors," Japanese Journal of Applied Physics, 2006, vol. 45, No. 5B, pp. 4303-4308.

Janotti, A. et al., "Native Point Defects in ZnO," Physical Review. B, Oct. 4, 2007, vol. 76, No. 16, pp. 165202-1-165202-22.

Park, J. et al., "Electronic Transport Properties of Amorphous Indium—Gallium—Zinc Oxide Semiconductor Upon Exposure to Water," Applied Physics Letters, 2008, vol. 92, pp. 072104-1-072104-3.

Hsieh, H. et al., "P-29:Modeling of Amorphous Oxide Semiconductor Thin Film Transistors and Subgap Density of States," SID Digest '08: SID International Symposium Digest of Technical Papers, 2008, vol. 39, pp. 1277-1280.

Janotti, A. et al., "Oxygen Vacancies in ZnO," Applied Physics Letters, 2005, vol. 87, pp. 122102-1-122102-3.

Oba, F. et al., "Defect Energetics in ZnO: A Hybrid Hartree-Fock Density Functional Study," Physical Review. B, 2008, vol. 77, pp. 245202-1-245202-6.

Orita, M. et al., "Amorphous Transparent Conductive Oxide InGaO3(ZnO)m (m<4):a Zn4s Conductor," Philosophical Magazine, 2001, vol. 81, No. 5, pp. 501-515.

Hosono, H. et al., "Working Hypothesis to Explore Novel Wide Band Gap Electrically Conducting Amorphous Oxides and Examples," Journal of Non-Crystalline Solids, 1996, vol. 198-200, pp. 165-169.

Mo, Y. et al., "Amorphous Oxide TFT Backplanes for Large Size AMOLED Displays," IDW '08: Proceedings of the 6th International Display Workshops, Dec. 3, 2008, pp. 581-584.

Kim, S. et al., "High-Performance Oxide Thin Film Transistors Passivated by Various Gas Plasmas," 214th ECS Meeting, 2008, No. 2317, ECS.

Clark, S. et al., "First Principles Methods Using Castep," Zeitschrift fur Kristallographie, 2005, vol. 220, pp. 567-570.

Lany, S. et al., "Dopability, Intrinsic Conductivity, and Nonstoichiometry of Transparent Conducting Oxides," Physical Review Letters, Jan. 26, 2007, vol. 98, pp. 045501-1-045501-4.

Park, J. et al., "Dry Etching of ZnO Films and Plasma-Induced Damage to Optical Properties," Journal of Vaccum Science & Technology B, Mar. 1, 2003, vol. 21, No. 2, pp. 800-803.

Oh, M. et al., "Improving the Gate Stability of ZnO Thin-Film Transistors With Aluminum Oxide Dielectric Layers," Journal of the Electrochemical Society, 2008, vol. 155, No. 12, pp. H1009-H1014.

Ueno, K. et al., "Field-Effect Transistor on SrTiO3 With Sputtered Al2O3 Gate Insulator," Applied Physics Letters, Sep. 1, 2003, vol. 83, No. 9, pp. 1755-1757.

Korean Office Action re Application No. KR 2012-0148238, dated Jan. 15, 2015.

Taiwanese Office Action re Application No. TW 103120335, dated Dec. 28, 2015.

\* cited by examiner 301a  301b  301c  301d

311

321

FIG. 9A
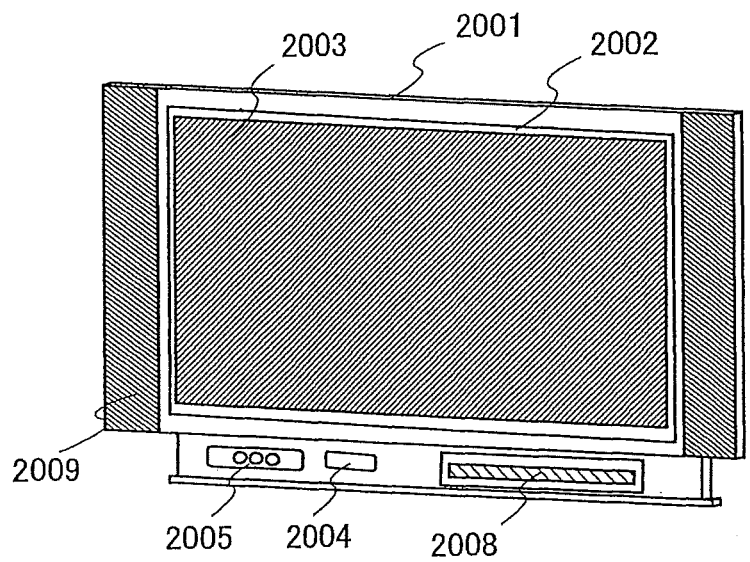
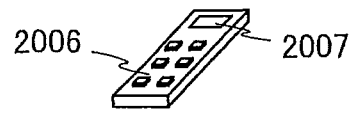
FIG. 9B
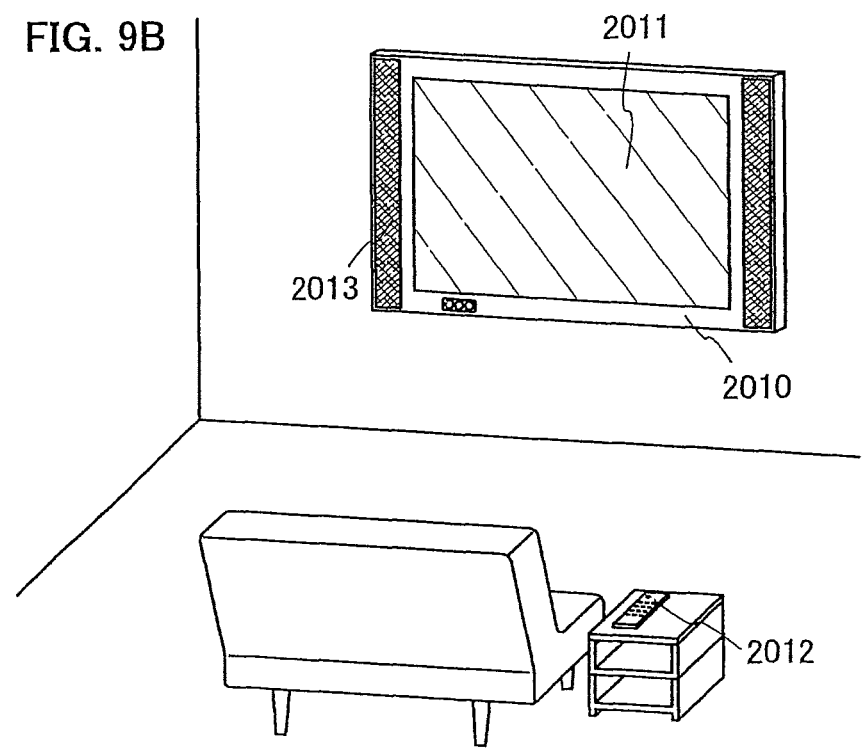

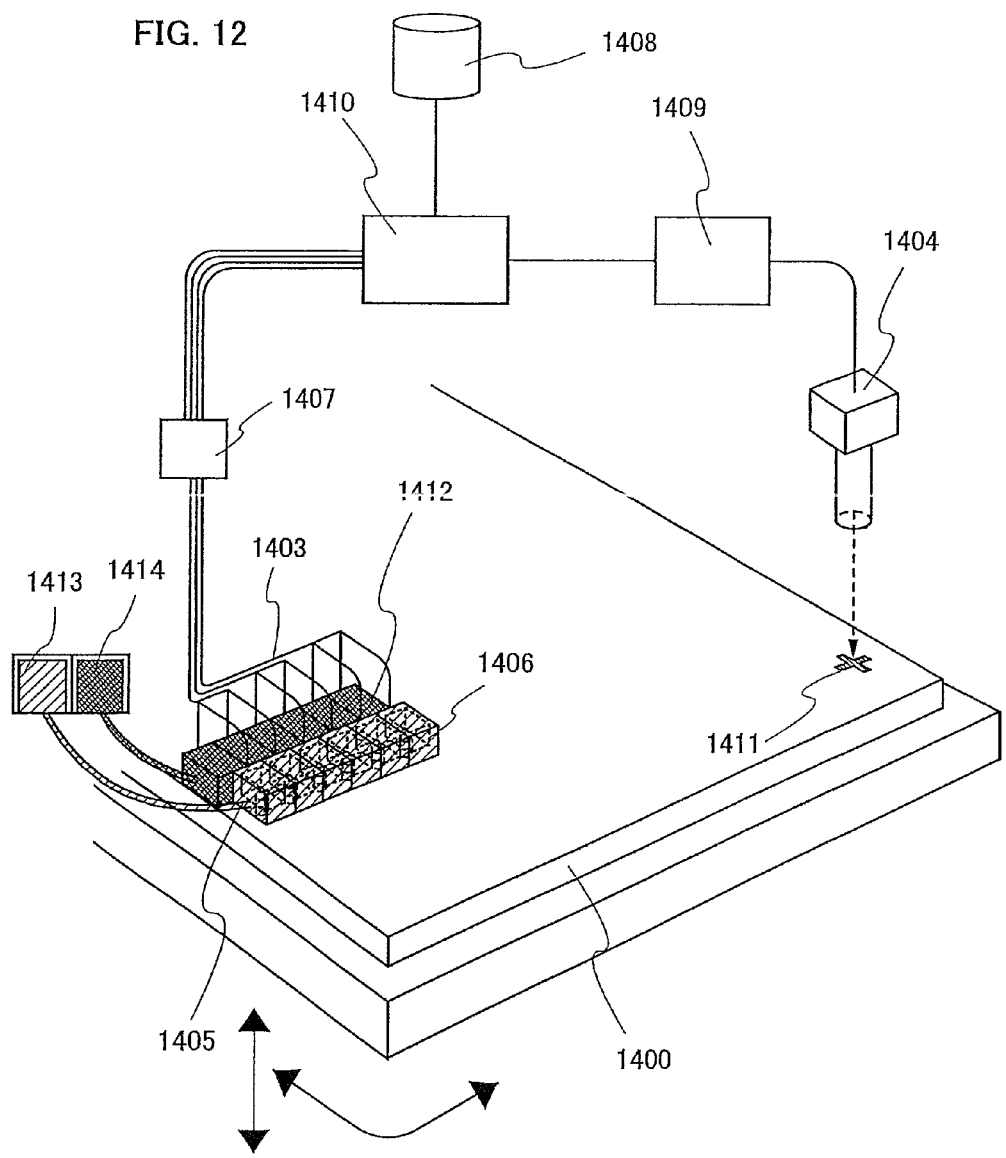

83  84

87  85  86  88

SEMICONDUCTOR DEVICE, ELECTRONIC DEVICE, AND METHOD OF MANUFACTURING SEMICONDUCTOR DEVICE

This application is a divisional of application Ser No. 13/241,577 filed on Sep. 23, 2011 which is a continuation of application Ser No. 12/464,252 filed on May 12, 2009 (now U.S. Pat. No. 8,487,436 issued Jul. 16, 2013) which is a divisional of application Ser. No. 11/333,646 filed on Jan. 17, 2006 (now U.S. Pat. No. 7,608,531 issued Oct. 27, 2009).

BACKGROUND OF THE INVENTION

1. Field of the Invention

The present invention relates to a semiconductor device, an electronic device, and a method of manufacturing a semiconductor device by using a printing method.

2. Description of the Related Art

In a thin film transistor (hereinafter also referred to as TFT) and an electronic circuit using the thin film transistor, various thin films of a semiconductor, an insulator, a conductor, and the like are stacked over a substrate, and they are appropriately processed into predetermined patterns by a photolithography technique. The photolithography technique is a technique in which a pattern of a circuit or the like which is formed using a material that does not transmit light over a transparent flat plate, which is referred to as a photomask, is transferred to an aimed substrate by using light. The photolithography technique is widely used in a process of manufacturing a semiconductor integrated circuit and the like.

The conventional manufacturing process using the photolithography technique requires multiple steps such as exposure, development, baking, and peeling only for treating a mask pattern formed by using a photosensitive organic resin material that is referred to as a photoresist. Therefore, the manufacturing cost is inevitably increased as the number of the photolithography steps is increased. In order to solve this problem, it has been attempted to manufacture TFTs with lower number of photolithography steps (Reference 1: Japanese Patent Laid-Open No. H11-251259).

SUMMARY OF THE INVENTION

It is an object of the present invention to provide a technique for manufacturing a TFT, an electronic circuit using the TFT, a semiconductor device, or a display device formed using the TFT even over a large substrate having a side of 1 meter or more with high yield at low cost in which the number of photolithography steps is reduced and the manufacturing process is simplified.

Further, it is an object of the present invention to provide a technique for stably forming a component such as a wiring included in the semiconductor device or a display device, with a sophisticated and fine shape.

In the present invention, a liquid composition is attached to a formation region, where wettability is controlled, in several separate dischargings, and a conductive layer, an insulating layer used as a mask layer for forming a conductive layer, or the like is/are formed by solidifying the liquid composition by baking, drying, or the like. When the composition is discharged several separate times, a stable pattern shape can be obtained without disconnection due to aggregation of droplets or the like. In the conductive layer or the insulating layer formed in the above manner, a droplet discharged in a latter step does not stay in an aimed position because of difference in wettability of formation regions, and moves to a high wettability region to be settled; thus, a continuous conductive or insulating layer is formed.

In the invention, the above described continuous conductive layer is formed by a plurality of discharging steps. Droplets of a composition containing a conductive material are attached to a formation region by a first discharge step to form first conductive layers having island shapes and formed with regular spacing therebetween over a line. The first conductive layers are almost circular in shape reflecting the shape of the droplets, and the centers are on a first centerline which is straight. Next, a second discharge step is conducted so as to fill spaces between the first conductive layers and connect the first conductive layers. The second discharge step is also conducted to discharge droplets of a composition to form second conductive layers with regular spacing therebetween over a line. At this time, the droplets are discharged so that the centers of the second conductive layers are deviated from the first centerline so as not to be formed on the first centerline. Therefore, the centerline which connects the droplets of the second discharge step is parallel to the first centerline with a regular spacing therebetween.

The second centerline of the droplets of the second discharge step is deviated from the first centerline of the droplets of the first discharge step; accordingly, the formed conductive layers have repeating wave patterns on the side ends to be a conductive layer which is meandering from side to side. Thus, a zigzagged wiring (conductive layer) can be obtained.

Further, the conductive layer (wiring) or the insulating layer formed in the invention has thicknesses as well as widths and the surface has projections and depressions, which reflect the shape of the droplets. This is because the conductive layer or the insulating layer is formed by solidifying a liquid composition containing a conductive or insulative material and by drying or baking after discharging. This applies to a mask layer which is formed by using the invention, and the mask layer has parts having different film thicknesses and the surface has unevenness. Therefore, the shape of the conductive layer or the insulating layer which is processed by using such a mask layer reflects the mask shape. The shape and the size of the projections and depressions on the surface are varied depending on the viscosity of the liquid composition, a drying step for solidifying the liquid composition by removing a solvent, or the like.

In this specification, a semiconductor device indicates a device, which can operate by utilizing semiconductor characteristics. By using the present invention, a semiconductor device such as a multi-layered wiring, a chip including a processor circuit (hereinafter also referred to as a processor chip), or the like can be manufactured.

The invention can be applied to a display device which is a device having a display function. The display device using the present invention includes a light emitting display device in which a TFT is connected to a light emitting element in which a layer containing an organic material or a mixture of organic and inorganic materials which provides light emission called electroluminescence (also referred to as EL) is interposed between electrodes, a liquid crystal display device using a liquid crystal element having a liquid crystal material as a display element, or the like.

A semiconductor device according to the invention includes a wiring having side ends with a continuous wave shape. The wiring contains an organic material.

A semiconductor device according to the invention includes a wiring meandering to the right and left. The wiring contains an organic material.

A semiconductor device according to the invention includes a gate electrode layer, a gate insulating layer, a semiconductor layer, a source electrode layer, and a drain electrode layer. The gate electrode layer has side ends with a continuous wave shape.

A semiconductor device according to the invention includes a gate electrode layer, a gate insulating layer, a semiconductor layer, a source electrode layer, and a drain electrode layer. The gate electrode layer is meandering to the right and left.

A semiconductor device according to the invention includes a gate electrode layer a gate insulating layer, a semiconductor layer, a source electrode layer, and a drain electrode layer. The source electrode layer and the drain electrode layer each have side ends with a continuous wave shape.

A semiconductor device according to the invention includes a gate electrode layer, a gate insulating layer, a semiconductor layer, a source electrode layer, and a drain electrode layer. The source electrode layer and the drain electrode layer are meandering to the right and left.

In a method for manufacturing a semiconductor device according to the invention, first droplets are discharged so that the centers of the first droplets are on a first line on a substrate surface by a first discharging step for discharging a plurality of droplets of a composition containing a conductive material to the substrate; second droplets are discharged to between the first droplets so that the centers of the second droplets are on a second line which has a uniform distance from the first line by a second discharging step for discharging a plurality of droplets, thereby forming a wiring having side ends with continuous wave shape.

In a method for manufacturing a semiconductor device according to the invention, first droplets are discharged so that the centers of the first droplets are on a first line on a substrate surface by a first discharging step for discharging a plurality of droplets of a composition containing a conductive material to the substrate; second droplets are discharged to between the first droplets so that the centers of the second droplets are on a second line which has a uniform distance from the first line by a second discharging step for discharging a plurality of droplets, thereby forming a wiring meandering to the right and left.

In a method for manufacturing a semiconductor device according to the invention, a first conductive film is formed; over the conductive film, a first droplets are discharged so that the centers of the first droplets are on a first line on a substrate surface by a first discharging step for discharging a plurality of droplets of a composition containing a mask forming material to the substrate; second droplets are discharged to between the first droplets so that the centers of the second droplets are on a second line which has a uniform distance from the first line by a second discharging step for discharging a plurality of droplets, thereby forming a mask layer having side ends with continuous wave shape. A wiring is formed by processing a conductive using the mask layer.

In a method for manufacturing a semiconductor device according to the invention, a first conductive film is formed; over the conductive film, a first droplets are discharged so that the centers of the first droplets are on a first line on a substrate surface by a first discharging step for discharging a plurality of droplets of a composition containing a mask forming material to the substrate; second droplets are discharged to between the first droplets so that the centers of the second droplets are on a second line which has a uniform distance from the first line by a second discharging step for discharging a plurality of droplets, thereby forming a mask layer meandering to the right and left. A wiring is formed by processing a conductive using the mask layer.

In accordance with the present invention, a component such as a wiring or the like included in a semiconductor device, a display device, or the like can be stably formed with a desired shape. Further, material loss and cost can be reduced. Hence, a semiconductor device and a display device with high performance and high reliability can be manufactured with high yield.

BRIEF DESCRIPTION OF THE DRAWINGS

In the accompanying drawings:

FIGS. 9A and 9B each show an electronic device to which the present invention is applied;

FIG. 12 explains the structure of a display device to which the present invention can be applied;

DETAILED DESCRIPTION OF THE INVENTION

Figure 1A:
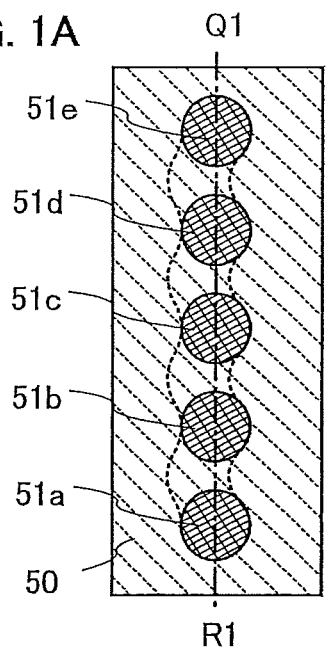
FIGS. 1A to 1C are schematic views of the present invention.

Embodiment modes and Embodiments of the present invention will be described in detail with reference to the drawings. It is easily understood by those skilled in the art that the invention is not limited by the following descriptions and various changes may be made in forms and details without departing from the spirit and scope of the invention. Therefore, the invention should not be limited to the descriptions of Embodiment modes and Embodiments below. The same reference numerals are commonly given to the same components or components having the same function in the structure of the invention, and the explanation will not be repeated.

Embodiment Mode 1

Embodiment Mode 1 of the present invention will be described with reference to FIGS. 1A to 1C.

One feature of the present invention is that at least one or more of components required to manufacture a semiconductor device or a display device, such as a conductive layer for forming a wiring layer or an electrode, or a mask layer for forming a predetermined pattern, is/are formed by a method capable of selectively forming a component into a desired shape to manufacture a semiconductor device or a display device. In the present invention, a component (also referred to as a pattern) refers to a conductive layer such as a wiring layer, a gate electrode layer, a source electrode layer, or a drain electrode layer; a semiconductor layer; a mask layer, an insulating layer, or the like, which is included in a thin film transistor or a display device, and includes any component that is formed to have a predetermined shape. A droplet discharge (ejection) method (including an ink-jet method), that can form a conductive layer, an insulating layer, or the like into a predetermined pattern by selectively discharging (ejecting) a droplet of a composition prepared for a particular purpose, is employed as a method capable of selectively forming a component to be formed into a desired pattern. In addition, a method capable of transferring or drawing a component into a desired pattern, for example, various printing methods (a method of forming a component to be formed into the desired pattern, such as screen (mimeograph) printing, offset (planograph) printing, relief printing, gravure (intaglio) printing, or the like), a dispensing method, a selective-coating method, or the like can also be used.

This embodiment mode uses a method of discharging (ejecting) a composition containing a component forming material, which is a fluid, as a droplet to form the composition containing a component forming material into a desired pattern. A droplet containing the component forming material is discharged to a component formation region, and the composition is fixed by baking, drying, and the like to form a component having a desired pattern.

One mode of a droplet discharge apparatus used for a droplet discharge method is shown in FIG. 12. Each of heads 1405 and 1412 of a droplet discharge means 1403 is connected to a control device 1407, and this control device 1407 is controlled by a computer 1410, so that a preprogrammed pattern can be formed. The formation position may be determined, for example, based on a marker 1411 that is formed over a substrate 1400. Alternatively, a reference point may be fixed based on an edge of the substrate 1400. The reference point is detected with an imaging means 1404, and changed into a digital signal using an image processing means 1409. Then, the digital signal is recognized by the computer 1410 to generate a control signal, and the control signal is transmitted to the control device 1407. An image sensor or the like using a charge coupled device (CCD) or a complementary metal oxide semiconductor can be used for the imaging device 1404. Information about a pattern to be formed over the substrate 1400 is stored in a storage medium 1408, and the control signal is transmitted to the control device 1407 based on the information, so that each of the heads 1405 and 1412 of the droplet discharge means 1403 can be individually controlled. The heads 1405 and 1412 are supplied with a material to be discharged from material supply sources 1413 and 1414 through pipes, respectively.

The head 1405 has an inside structure which has a space to be filled with a liquid material as shown by dotted lines 1406 and a nozzle which is a discharge opening. Although it is not shown, the inside structure of the head 1412 is similar to that of the head 1405. When the nozzle sizes of the heads 1405 and 1412 are different from each other, different materials can be discharged concurrently to have different widths. A conductive material, an organic material, an inorganic material, or the like can be each discharged from one head. In the case of drawing over a large area such as an interlayer film, one material can be concurrently discharged from a plurality of nozzles to improve throughput, and thus, drawing can be performed. When a large substrate is used, the heads 1405 and 1412 can freely scan over the substrate in a direction indicated by arrows in FIG. 12, and a region on which drawing is performed can be freely set. Thus, a plurality of the same patterns can be drawn over one substrate.

In the case of forming a conductive layer by a droplet discharge method, a composition containing particles of a conductive material is discharged, and fused or welded by baking to solidify the composition. A conductive layer (or an insulating layer) formed by discharging and baking the composition containing a conductive material is, in many cases, a polycrystalline state with many grain boundaries whereas a conductive layer (or an insulating layer) formed by sputtering or the like has, in many cases, a columnar structure.

The general idea of the embodiment mode of the present invention will be described using a method of forming conductive layers with reference to FIGS. 1A to 1C. FIGS. 1A to 1C are top views of the conductive layers.

Figure 1B:
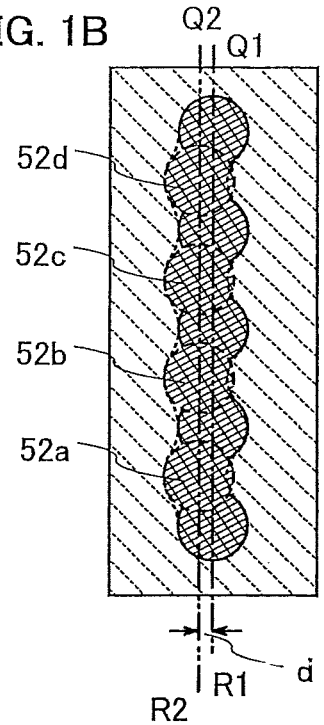
Figure 1C:
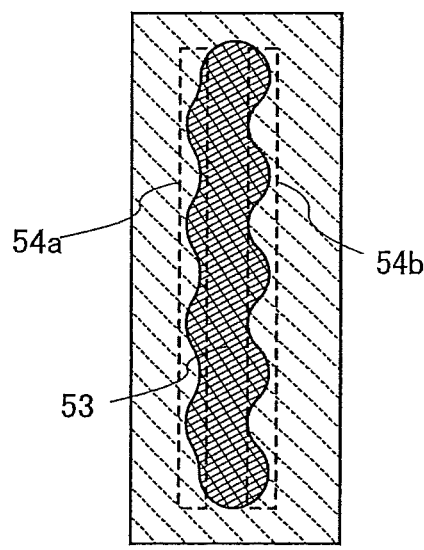

As shown in FIGS. 1A to 1C, conductive layers are formed over a substrate 50. Accordingly, wettability of a surface of the substrate 50, which is a formation region of the conductive layers, with respect to a liquid composition containing a conductive material which forms the conductive layers is necessarily controlled. The degree of wettability may be appropriately set depending on the width or the pattern shape of the conductive layer to be formed, and the wettability can be controlled by the following treatment. In this embodiment mode, in forming the conductive layers, the contact angle between the formation region and the composition containing a conductive material is preferably 20 degrees or more, more preferably from 20 degrees to 40 degrees.

Wettability of a surface of a solid object is affected by a state of the surface. When a substance having low wettability with respect to a liquid composition is formed, the surface becomes a region having low wettability with respect to the liquid composition (hereinafter, also referred to as a low wettability region). When a substance having high wettability with respect to a liquid composition is formed, the surface becomes a region having high wettability with respect to the liquid composition (hereinafter, also referred to as a high wettability region). In the invention, a treatment of controlling wettability of a surface means to form regions each having different wettability with respect to a liquid composition in a region to be attached with the liquid composition.

The degree of the wettability also affects the value of the contact angle. A region having a large contact angle with a liquid composition is a low wettability region, whereas a region having a small contact angle is a high wettability region. In the case where the contact angle is large, a fluid liquid composition does not spread on the surface of the region, is repelled by the surface, so that the surface is not wetted. In the case that the contact angle is small, the fluid liquid composition having fluidity spreads on the surface and the surface is wetted well. Therefore, regions having different wettability have different surface energy. The surface of a low wettability region has low surface energy, and the surface of a high wettability region has high surface energy.

First, a method of forming a substance having low wettability and controlling to reduce the wettability of a surface of the formation region is described. As the substance having low wettability, a substance containing a fluorocarbon group (fluorocarbon chain) or a substance containing a silane coupling agent can be used. The silane coupling agent is represented by the chemical formula: $R_n\text{—Si—}X_{(4-n)}$ ($n=1, 2, 3$). In this chemical formula, R represents a substance containing a relatively inactive group such as an alkyl group. X represents a hydrolyzable group such as halogen, a methoxy group, an ethoxy group, or an acetoxy group that is bondable with a hydroxyl group or an adsorbed water on a substrate surface by a condensation.

As a representative example of a silane coupling agent, a fluorine-based silane coupling agent that has a fluoroalkyl group (such as fluoroalkylsilane (FAS)) may be used for R, so that the wettability can be further reduced. R in FAS has a structure expressed by $(CF_3)(CF_2)_x(CH_2)_y$ (x is an integer in the range of 0 to 10, and y is an integer in the range of 0 to 4). When a plurality of Rs or Xs is bonded with Si, the Rs or Xs may be the same or different from one another. Typically, the following can be used as FAS: fluoroalkylsilane such as, heptadecafluoro tetrahydrodecyl triethoxysilane, heptadecafluoro tetrahydrodecyl trichlorosilane, tridecafluoro tetrahydrooctyl trichlorosilane, or trifluoropropyl trimethoxysilane.

As the substance having low wettability, a substance that does not have a fluorocarbon chain but an alkyl group can be used for R of the silane coupling agent as well, for example, octadecyltrimethoxysilane or the like can be used as an organosilane.

As a solvent of a solution containing a low wettability substance, a solvent containing hydrocarbon such as n-pentane, n-hexane, n-heptane, n-octane, n-decane, dicyclopentane, benzene, toluene, xylene, durene, indene, tetrahydronaphthalene, decahydronaphthalene, or squalane; tetrahydrofuran; or the like is used.

As an example of a composition for controlling and reducing wettability to form a low wettability region, a material having a fluorocarbon chain (e.g., fluorine-based resin) can be used. As a fluorine-based resin, the following can be used: a polytetrafluoroethylene (PTFE) resin; a perfluoroalkoxyalkane (PFA) or tetrafluoroethylene perfluoroalkylvinylether copolymer resin; a perfluoroethylene propene copolymer (PFEP) or tetrafluoroethylene-hexafluoropropylene copolymer resin; an ethylene-tetrafluoroethylene copolymer (ETFE) or tetrafluoroethylene-ethylene copolymer resin; a polyvinylidene fluoride (PVDF) resin; a polychlorotrifluoro ethylene (PCTFE) or polytrifluorochloroethylene resin; an ethylene-chlorotrifluoroethylene copolymer (ECTFE) or polytrifluorochloroethylene-ethylene copolymer resin; a polytetrafluoroethylene-perfluorodioxole copolymer (TFE/PDD); a polyvinyl fluoride (PVF) or vinyl fluoride resin; or the like.

Further, when a treatment by $CF_4$ plasma or the like is performed on an inorganic or organic material, wettability can be reduced. As the organic material, for instance, a material of a solvent such as $H_2O$ mixed with a water-soluble resin such as polyvinyl alcohol (PVA) can be used. In addition, a combination of PVA and another water-soluble resin can be used. An organic material (organic resin material) (polyimide or acrylic) or a siloxane material may be used. Note that the siloxane material corresponds to a resin containing an Si—O—Si bond. Siloxane has a skeletal structure formed from a bond of silicon (Si) and oxygen (O). As a substituent, an organic group containing at least hydrogen (e.g. an alkyl group or aromatic hydrocarbon) is used. Alternatively, a fluoro group may be used as the substituent. An organic group containing at least hydrogen and a fluoro group may also be used as the substituent.

In this embodiment mode, FAS is formed over the substrate 50 by spin coating; thus, wettability of the surface of the substrate 50 is controlled. The wettability is with respect to a liquid composition containing a conductive material which is included in a conductive layer to be formed in a later step.

When the conductive layer is formed by one-time continuous discharging, droplets are aggregated, and a puddle of liquid called a bulge is caused. The conductive layer is sometimes disconnected. Therefore, in the invention, the conductive layer is formed by a plurality of dischargings. In other words, in the first discharging, a liquid composition containing a conductive material is attached to dot the formation region so that droplets does not have contact with each other. Next, in the second discharging, a composition containing a conductive material is discharged to fill a space between the droplets of the conductive material discharged in the first discharging. Accordingly, a continuous conductive layer is formed. Since the time has passed, the composition containing a conductive material discharged in the first discharging is solidified by drying. Therefore, aggregation between the conductive materials discharged in the first and second dischargings does not occur. When a conductive layer is formed in such a manner, a stable conductive layer can be formed even when the layer has a fine line shape.

In a first discharging step, droplets of a composition containing a conductive material are discharged to the substrate 50 in which the wettability of the surface is controlled, on a line, so as to form island-shape conductive layers 51a, 51b, 51c, 51d, and 51e (FIG. 1A). The island-shape conductive layers 51a, 51b, 51c, 51d, and 51e reflect the shape of the droplets. A first centerline Q1-R1 connects the centers of the island-shape conductive layers.

Next, in a second discharging step, droplets of a composition containing a conductive material are discharged to form conductive layers 52a, 52b, 52c, and 52d, so that the centers of the conductive layers 52a, 52b, 52c, and 52d are deviated from the first centerline Q1-R1 with a spacing of d (FIG. 1B). The droplets discharged in the second discharging steps form the conductive layers 52a, 52b, 52c, and 52d immediately after the droplets reach (are attached to) the substrate 50 to fill spaces between the conductive layers; thus, a continuous conductive layer 53 is formed (FIG. 1C). A second centerline Q2-R2 connects the centers of the conductive layers 52a, 52b, 52c, and 52d formed by the second discharging step. The first centerline Q1-R1 and the second centerline Q2-R2 are disposed in parallel with a predetermined spacing d therebetween.

Since the centerlines are deviated between the conductive layers formed in the first and second discharging steps, the conductive layer 53 has a shape meandering side to side with a continuous wave shape on each of the side ends 54a and 54b. The side ends have wave shape with amplitude. The range of the meandering (the range of the line width of the conductive layer) is preferably four times or less of the diameter of the droplets. When the centers of the conductive layers 51a to 51e which are formed in the first discharging step and the conductive layers 52a to 52d which are formed in the second discharging step are connected, not a straight line but a line which regularly bends side to side is formed. The formed conductive layer 53 formed in this manner has at least one curved part, and the side ends have irregularities. In this embodiment mode, the projections of the side ends 54a and 54b respectively correspond to the depressions of the side ends 54a and 54b of the conductive layer 53 with respect to the centerline. Thus, the width of the conductive layer 53 is almost uniform.

However, the conductive layer 53 does not need to have a uniform line width. Wettability with respect to the liquid composition containing a conductive material is different between the surface of the conductive layer formed by solidifying the composition containing a conductive material discharged in the first discharging step and the surface of the substrate 50 whose wettability has been controlled as previously described. Part of the liquid composition containing a conductive material to be discharged in the second discharging step is discharged to both the conductive layer formed by the first discharging step and the surface of the substrate 50 to bridge them. Part of the liquid composition containing a conductive material which is greatly affected by wettability of a surface moves to flow over the conductive layer having high wettability formed by the first discharging step. As a result, the width of the part of the conductive layer formed by the first discharging step may be wider than the width of a portion of the conductive layer formed by the second discharging step. In this case, a conductive layer having nonuniform line widths which regularly vary.

In the case of forming the conductive layers which are meandering side to side and of which side ends have wave shape, to be adjacent to each other, if projections of the respective conductive layers are formed adjacent to each other, distance between the projections of the conductive layers becomes short, and if depressions of the respective conductive layers are formed adjacent to each other, distance between the depressions of the conductive layers becomes long. Thus, the distance between the conductive layers is varied and nonuniform. Further, the problem of defective formation in which conductive layers have contact with each other may be caused, and it may be difficult to form fine conductive or insulating layers with a stable distance.

Figure 2A:
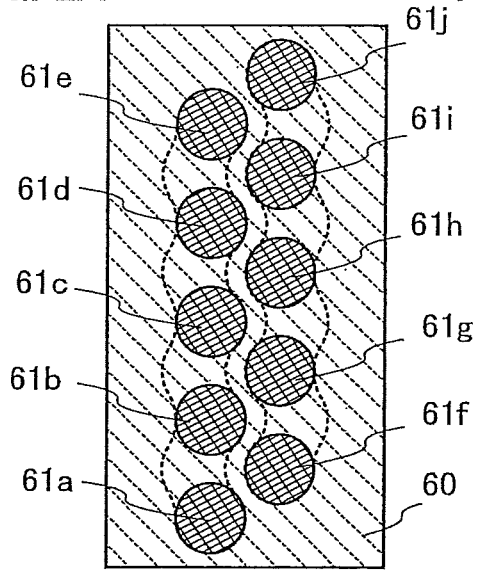
FIGS. 2A to 2C are schematic views of the present invention.

An example of forming conductive layers to be adjacent to each other will be described with reference to FIGS. 2A to 2C. In this embodiment mode, as shown in FIG. 2A, conductive layers 61a to 61e and conductive layers 61f to 61j are formed in a first discharging step. At this time, centers of the conductive layers 61a to 61e, which are part of a first conductive layer, and centers of the conductive layers 61f to 61j, which are part of a second conductive layer, which is adjacent to the first conductive layer, are not on the same line in their width direction. The center of the conductive layer 61f is set in a region which is within width directions of a region between the centers of the conductive layers 61a and 61b. The center of the conductive layer 61f is more preferably set in a region which is within line width directions of the central region of three regions into which the length between the centers of the conductive layers 61a and 61b is divided.

Figure 2B:
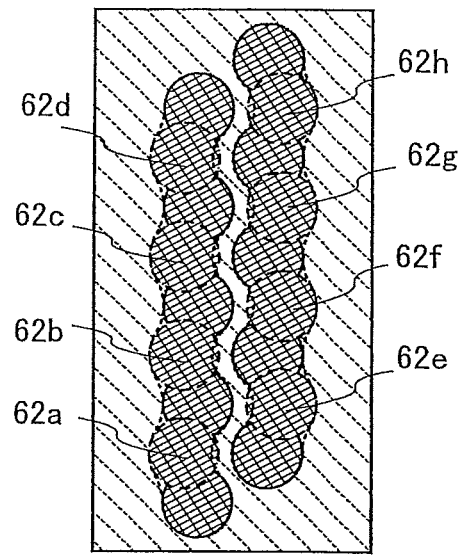

Next, as shown in FIG. 2B, a first conductive layer 63a is formed by forming conductive layers 62a to 62d by discharging a composition containing a conductive material in a second discharging step to fill spaces between the conductive layers 61a to 61e formed in the first discharging step. Similarly, a second conductive layer 63b is formed by forming conductive layers 62e to 62h by discharging the composition containing a conductive material in the second discharging step to fill spaces between the conductive layers 61f to 61j. As shown in FIG. 2B, the conductive layers 62a to 62d and the conductive layers 62e to 62h are formed in the second discharging step to have centerlines outer than the centerlines of the conductive layers 61a to 61e and the conductive layers which are formed in the first discharging step.

Figure 2C:
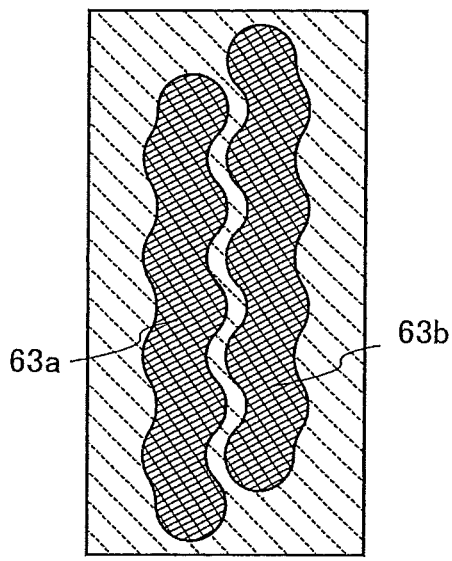

After that, the first conductive layer 63a and the second conductive layer 63b having continuous regular wave shape are formed as shown in FIG. 2C by solidifying with drying, baking, or the like. The first conductive layer 63a and the second conductive layer 63b are formed by a discharging method of the present invention so that projections of the first conductive layer 63a and the second conductive layer 63b are not immediately lateral to each other and are staggered. The distance between the first conductive layer 63a and the second conductive layer 63b can be shorter than the distance of the centerlines of the first conductive layer 63a and the second conductive layer 63b. Accordingly, even when the distance between the fit conductive layer 63a and the second conductive layer 63b is short, the first conductive layer 63a and the second conductive layer 63b can be formed stably. An insulating layer can be formed by discharging an insulative material in a similar manner. Since insulating layers can be formed to have uniform distance therebetween, when a mask layer formed in such a manner is used, fine processing with precision can be performed. Since a desired shape can be obtained by fine processing, when the conductive layers are used as source and drain electrode layers, the channel width can be reduced. Accordingly, a highly reliable semiconductor device, which can operate at high speed with high performance, can be manufactured. Since the number of defects due to defective formation is decreased in the manufacturing process, which is effective in improving yield and increasing productivity.

In this embodiment mode, the conductive layer 53, the first conductive layer 63a, and the second conductive layer 63b are formed by using a droplet discharge means. The droplet discharge means is a general term for a means for discharging a droplet, including a nozzle having a discharge opening of a composition, a head equipped with a single or a plurality of nozzles, or the like. The diameter of the nozzle included in the droplet discharge means is set in the range of 0.02 µm to 100 µm (preferably, 0.02 µm to 30 µm or less), and the amount of the composition to be discharged from the nozzle is set in the range of 0.001 pl to 100 pl (preferably, 0.1 pl to 40 pl, more preferably, 0.1 pl to 10 pl or less). The amount of the composition to be discharged increases in proportion to the size of the diameter of the nozzle. Further, it is preferable that the distance between an object to be processed and the discharge opening of the nozzle is as short as possible in order to drop a droplet on a desired position. Preferably, the distance is set within the approximate range of 0.1 mm to 3 mm (more preferably, 0.1 mm to 1 mm or less).

For the composition to be discharged from the discharge opening, a conductive material dissolved or dispersed in a solvent is used. The conductive material corresponds to fine particles of one or more kinds of metal selected from Ag, Au, Cu, Ni, Pt, Pd, Ir, Rh, W, and Al, and may be mixed with a fine particle or dispersed nanoparticle of one or more kinds of sulfide of a metal such as Cd or Zn, an oxide of Fe, Ti, Si, Ge, Zr, Ba, or the like, silver halide, or the like. The conductive material may correspond to indium tin oxide (ITO), indium tin oxide containing silicon oxide (ITSO), organoindium, organotin, zinc oxide, titanium nitride, or the like, which is used for a transparent conductive film. However, as for the composition to be discharged from the discharge opening, it is preferable to use one of the materials of gold, silver, or copper dissolved or dispersed in a solvent, taking into consideration the resistivity value. It is more preferable to use silver and copper having low resistivity. However, when silver or copper is used, a barrier film may be additionally provided as a countermeasure against impurities. A silicon nitride film or nickel boron (NiB) can be used for the barrier film.

The composition to be discharged is a conductive material dissolved or dispersed in a solvent, and further may contain a dispersant or a thermosetting resin called a binder. In particular, the binder has a function of preventing generation of a crack or a fused state during baking. Therefore, a conductive layer to be formed may contain an organic material. The organic material contained varies depending on temperature, atmosphere, or time for heating. The organic material refers to an organic resin or the like which functions as a binder of metal particles, a solvent, a dispersant, or a coating agent. An organic resin such as polyimide resin, acrylic resin, novolac resin, melamine resin, phenol resin, epoxy resin, silicone resin, furan resin, or diallyl phthalate resin can be used.

Alternatively, particles in which a conductive material is coated with another conductive material may be used. For example, three-layer structure particles in which copper is coated with nickel boron (NiB), which is further coated with silver, may be used. As for the solvent, ester such as butyl acetate or ethyl acetate; alcohol such as isopropyl alcohol or ethyl alcohol; organic solvent such as methyl ethyl ketone or acetone; water, or the like is used. The viscosity of the composition is preferably 20 mPa·s or less. This prevents the composition from drying to clog the discharge opening, and enables the composition to be discharged smoothly from the discharge opening. The surface tension of the composition is preferably 40 mN/m or less. However, the viscosity of the composition and the like may be appropriately controlled depending on a solvent to be used and the use. For example, the viscosity of a composition in which ITO, organic indium, or organotin is dissolved or dispersed in a solvent may be set from 5 mPa·s to 20 mPa·s, the viscosity of a composition in which silver is dissolved or dispersed in a solvent may be set from 5 mPa·s to 20 mPa·s, and the viscosity of a composition in which gold is dissolved or dispersed in a solvent may be set from 5 mPa·s to 20 mPa·s.

The conductive layer may be formed with a stack of a plurality of conductive materials. For example, the conductive layer may be formed first by a droplet discharge method using silver as a conductive material, and a plating with copper or the like may be performed thereafter. Plating may be performed by an electroplating or chemical (electroless) plating method. Plating may be performed by soaking a substrate surface into a container filled with a solution containing a plating material; alternatively, the solution containing a plating material may be applied by placing the substrate vertically or obliquely, and pouring the solution over the substrate surface. When the plating is performed by applying a solution with the substrate stood, there is an advantage that an apparatus used for the process can be downsized even if a large substrate is used.

Although it depends on the diameter of each nozzle, the shape of the pattern of the conductive layer, and the like, the diameter of particles of the conductive material is preferably as small as possible, for the purpose of preventing nozzles from being clogged and for manufacturing a fine pattern. Preferably, the diameter of the particles of the conductive material is 0.1 µm or less. The composition is formed by a method such as an electrolyzing method, an atomizing method, or a wet reduction method, and the size of the particles to be obtained is typically about 0.01 µm to 10 µm. However, when a gas evaporation method is employed, nanoparticles protected by a dispersant are minute, about 7 nm. When the surface of each particle is covered with a coating agent, the nanoparticles do not aggregate in the solvent, are uniformly dispersed in the solvent at room temperature, and behave similarly to a liquid. Accordingly, it is preferable to use a coating agent.

The process of discharging a liquid composition may be performed under reduced pressure. In addition, when the process is performed under reduced pressure, an oxide film or the like is not formed over the surface of a conductor, which is preferable. After discharging the composition, either or both steps of drying and baking is/are performed. Both the drying and baking steps are heat treatments. For example, drying may be performed for three minutes at 100° C. and baking may be performed for 15 minutes to 60 minutes at 200° C. to 550° C.; thus, the treatment temperatures and treatment period may differ corresponding to the purpose. The steps of drying and baking are performed under normal pressure or reduced pressure, by laser light irradiation, rapid thermal annealing, heating using a heating furnace, or the like. Note that the timing of the heat treatment and the number of times of the heat treatment is not particularly limited. The substrate may be heated in advance to perform the steps of drying and baking well. Although the temperature of the substrate at the time depends on the material of the substrate or the like, it is typically 100° C. to 800° C. (preferably, 200° C. to 550° C.). Through these steps, the nanoparticles are made in contact with each other and fusion and welding are accelerated by a hardening and shrinking of a surrounding resin, while the solvent in the composition is volatilized or the dispersant is chemically removed.

A gas laser or a solid-state laser of a continuous oscillation or pulsed oscillation may be used for laser light irradiation. An excimer laser, a YAG laser, or the like can be used as the former gas laser A laser using a crystal of YAG, $YVO_4$, $GdVO_4$, or the like which is doped with Cr, Nd, or the like can be used as the latter solid-state laser. Note that it is preferable to use a continuous wave laser in consideration of the absorption rate of laser light. Moreover, a laser irradiation method in which pulsed and continuous wave lasers are combined may be used. However, it is preferable that the heat treatment by laser light irradiation is instantaneously performed within several microseconds to several tens of seconds so as not to damage the substrate, depending on heat resistance of the substrate. Rapid thermal annealing (RTA) is carried out by raising the temperature rapidly and heating instantaneously for several microseconds to several minutes using an infrared lamp or a halogen lamp which emits light of ultraviolet to infrared light in an inert gas atmosphere. Since the treatment is performed instantaneously, only a thin film on a top surface can be actually heated and the lower layer of the film is not affected. In other words, even a substrate having low heat resistance such as a plastic substrate is not affected.

After forming a conductive layer, an insulating layer, or the like by discharging a composition by a droplet discharge method, the surface thereof may be planarized by pressing with pressure to enhance the flatness. As a pressing method, irregularities on the surface may be smoothed and reduced by moving a roller-shaped object over the surface, or the surface may be vertically pressed with a flat plate-shaped object. A heating process may be performed at the time of pressing. Alternatively, the irregularities on the surface may be eliminated with an air knife after softening or melting the surface with a solvent or the like. Further, CMP may be also used for polishing the surface. This process can be applied to planarizing a surface when the irregularities are caused by a droplet discharge method.

By using the invention, even when wirings or the like are designed to be dense and sophisticated and as a result of downsizing or thinning of a film, they can be formed stably into desired patterns with good shapes, which improves reliability and productivity. Further, material loss and cost can be reduced. Hence, a semiconductor device or a display device with high performance and high reliability can be manufactured with high yield.

Embodiment Mode 2

Figure 6A:
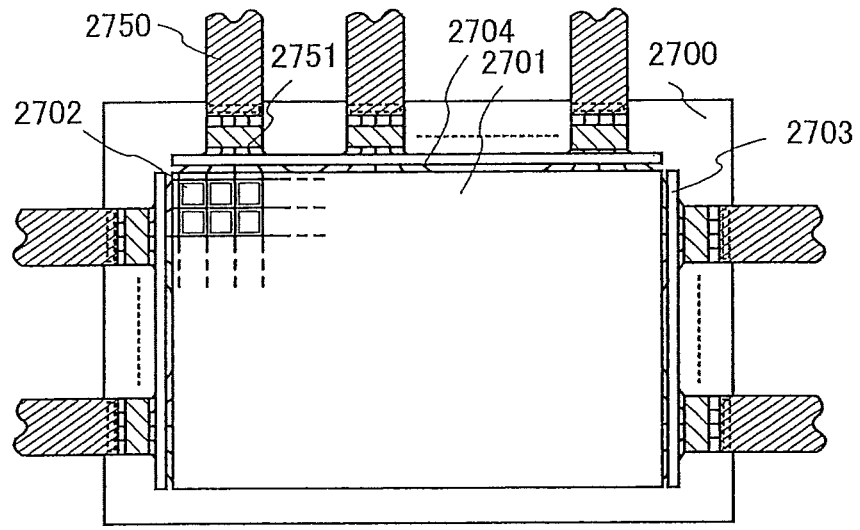
FIGS. 6A and 6B each explain a display device of the present invention.

In this embodiment mode, an example of a display device using the present invention will be described FIG. 6A is a top view showing a structure of a display panel using the present invention. A pixel area 2701 in which pixels 2702 are arranged in matrix, a scan line input terminal 2703, and a signal line input terminal 2704 are formed over a substrate 2700 having an insulating surface. The number of the pixels may be determined in accordance with various standards. In the case of XGA and RGB display, the number of the pixels may be 1024×768×3 (RGB).

Similarly, in the case of UXGA and RGB display, the number of the pixels may be 1600×1200×3 (RGB), and in the case of a full-spec high vision and RGB display, it may be 1920×1080×3 (RGB).

The pixels 2702 are formed in matrix at intersections of scan lines extended from the scan line input terminal 2703 and signal lines extended from the signal line input terminal 2704. Each pixel 2702 is provided with a switching element and a pixel electrode connected thereto. A typical example of a switching element is a TFT. The gate electrode of the TFT is connected to the scan line, and a source electrode or a drain electrode of the TFT is connected to the signal line, which enables each pixel to be independently controlled by a signal inputted from the outside.

A TFT includes a semiconductor layer, a gate insulating layer, and a gate electrode layer as main components, and a wiring layer connected to source and drain regions which are formed in the semiconductor layer accompanies thereto. In terms of the structure, a top gate type in which a semiconductor layer, a gate insulating layer, and a gate electrode layer are provided from the substrate side; a bottom gate type in which a gate electrode layer, a gate insulating layer, and a semiconductor layer are provided from the substrate side; and the like are typically known. Any of the structures may be applied to the present invention.

Figure 6B:
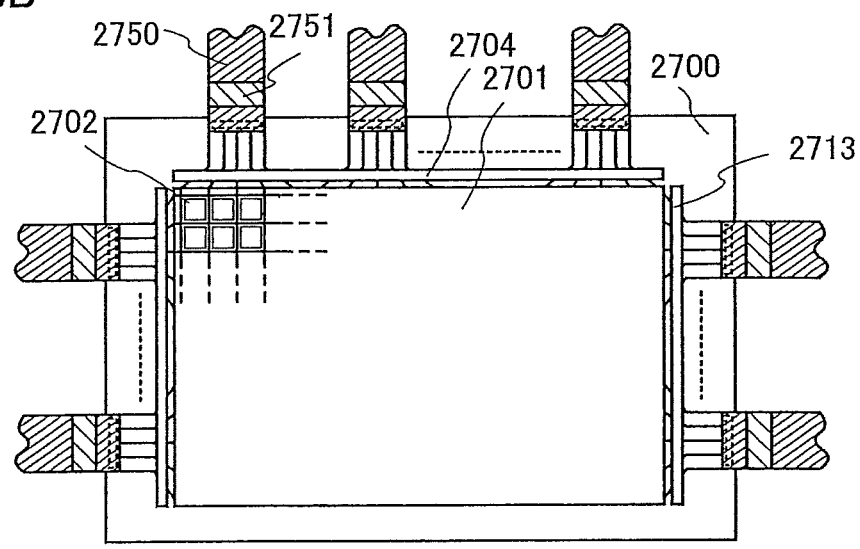

A driver IC 2751 for inputting signals to a scan line or a signal line may be mounted on a substrate 2700 by a COG (Chip on Glass) method as shown in FIG. 6A. As another mounting mode, a TAB (Tape Automated Bonding) method may also be used as shown in FIG. 6B. The driver IC may be formed on a single crystal semiconductor substrate or may be formed over a glass substrate. In FIGS. 6A and 6B, the driver IC 2751 is connected to an FPC (Flexible Printed Circuit) 2750.

When a TFT provided in a pixel is formed from a polycrystalline (microcrystalline) semiconductor having high crystallinity, a scan line driver circuit may be formed over a substrate. When the TFT provided in a pixel is formed using a polycrystalline (microcrystalline) semiconductor, a single crystal semiconductor, or the like having high electron mobility, a scan line driver circuit and a signal line driver circuit can be formed over a glass substrate over which the TFT in the pixel is formed.

Figure 4:
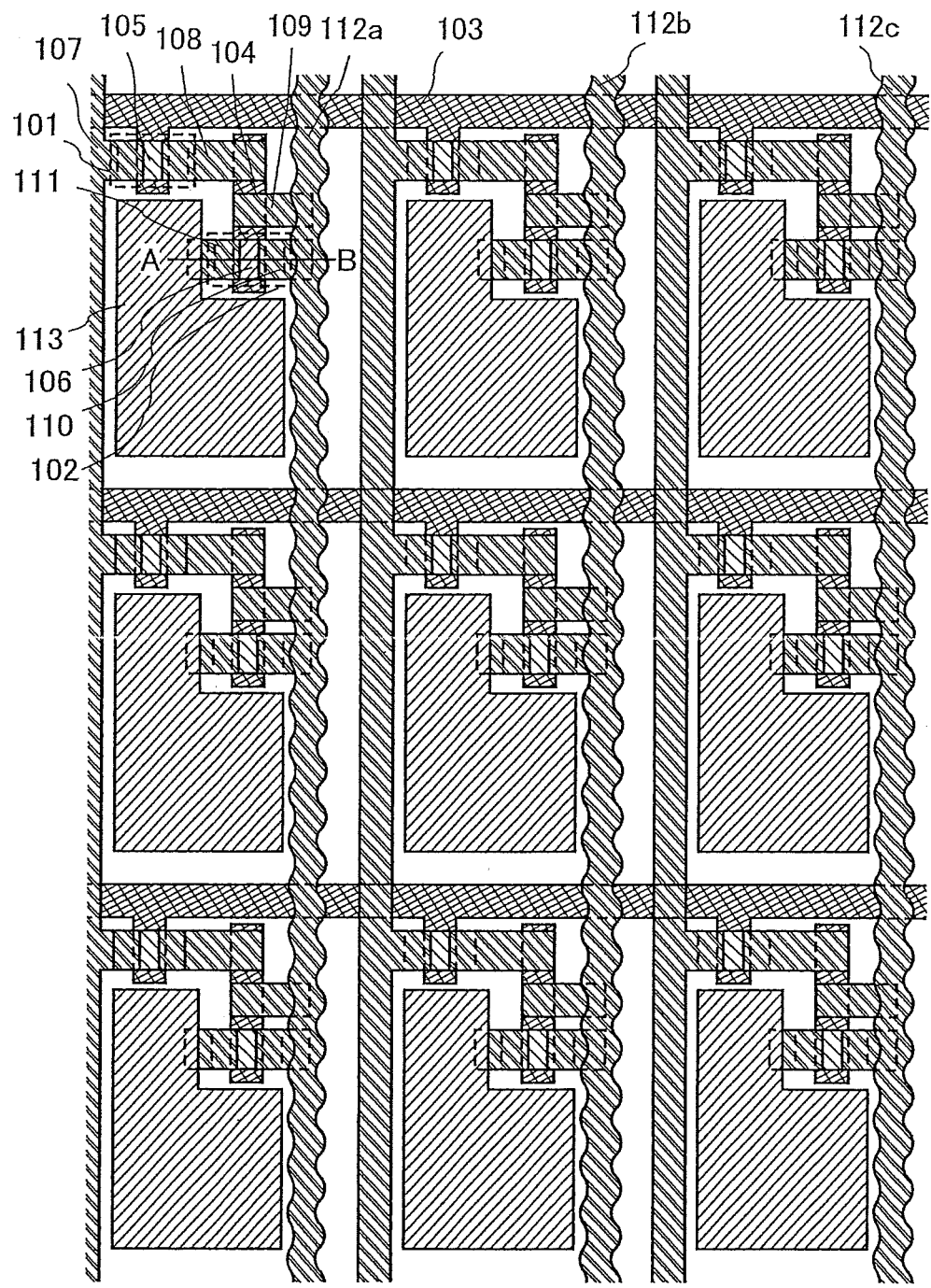
FIG. 4 is a top view of a display device of the present invention.
Figure 13A:
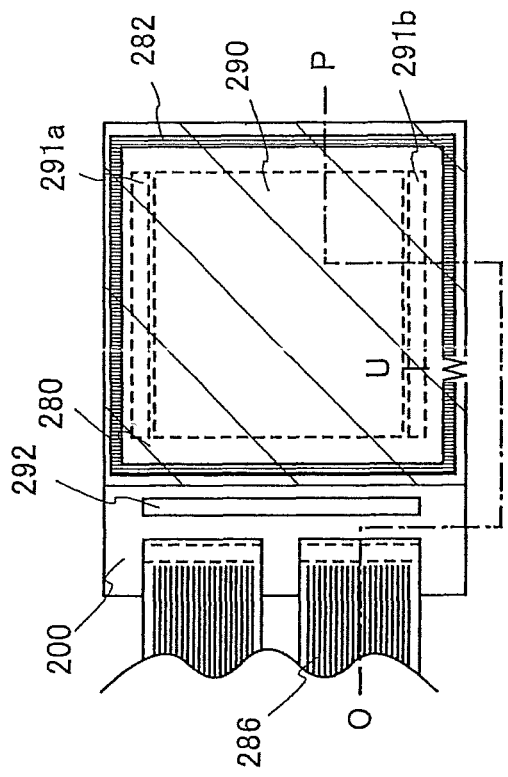
FIGS. 13A and 13B each show a display device of the present invention.
Figure 13B:
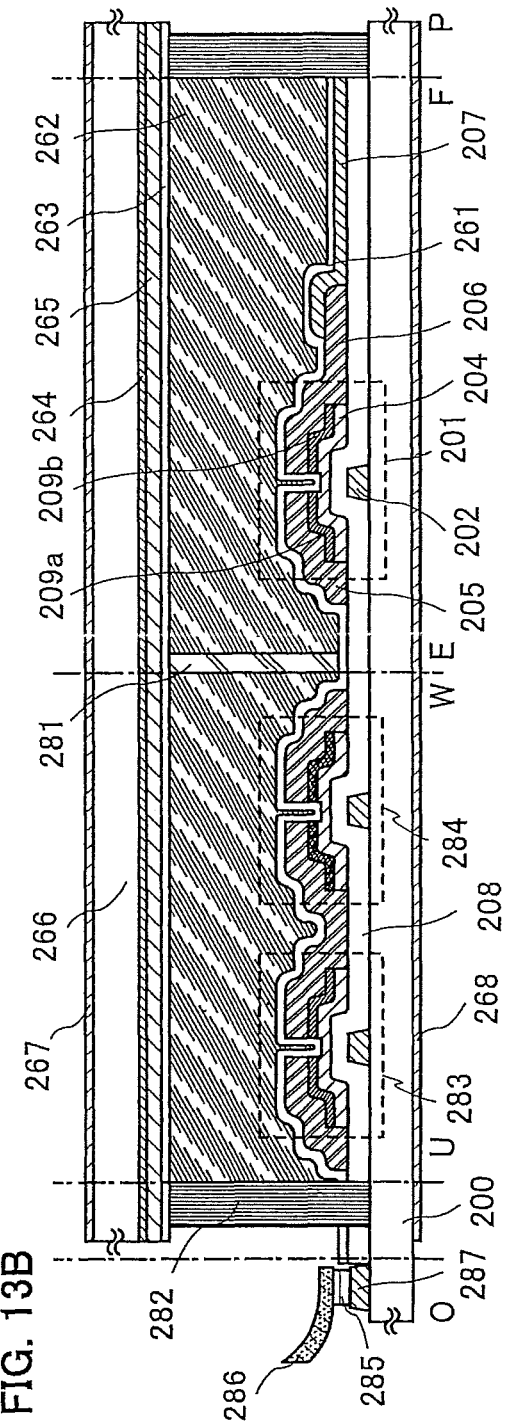
Figure 14A:
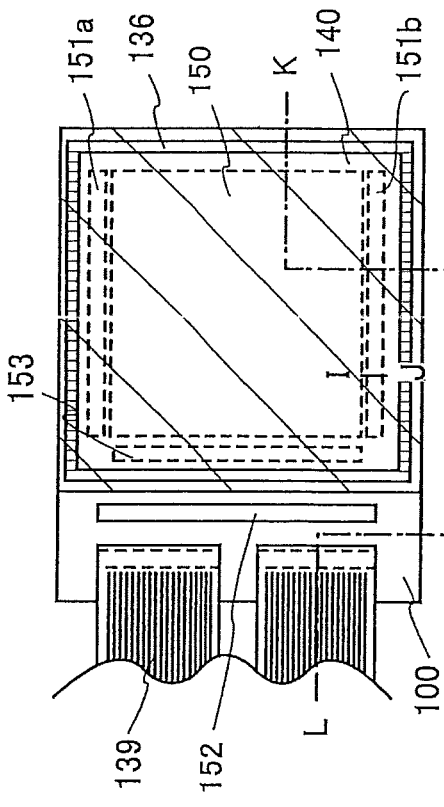
FIGS. 14A and 14B each show a display device of the present invention.
Figure 14B:
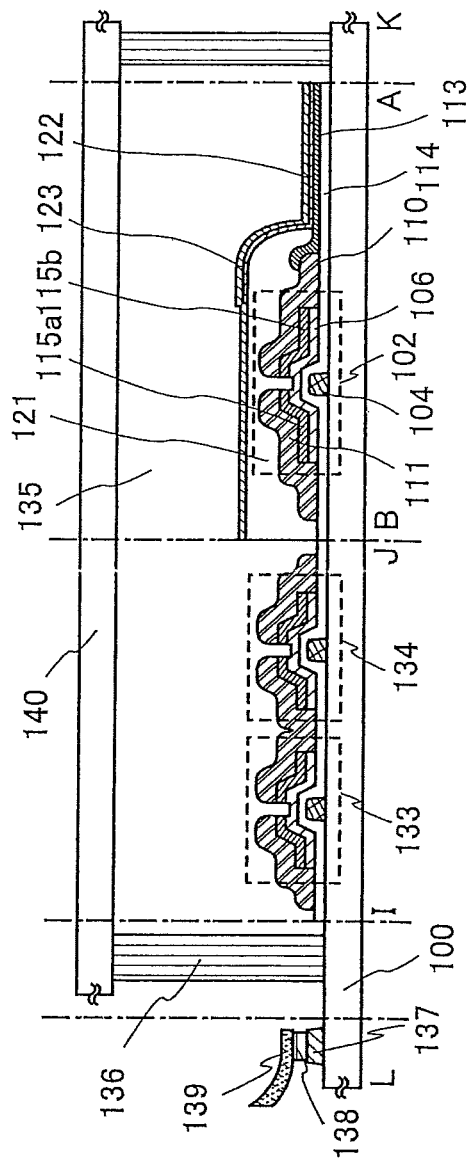

The embodiment mode of the present invention will be described with reference to FIGS. 4 to 14A and 14B. Specifically, a method of manufacturing a light-emitting display device having a light emitting element using the invention will be described. FIG. 4 is a top view of a pixel area of a display device. FIGS. 14A and 14B are cross-sectional views taken along lines A-B in FIG. 4. FIG. 14A is a top view, and FIG. 14B is a cross-sectional view taken along line L-K (including line I-J) in FIG. 14A.

A glass substrate made of barium borosilicate glass, alumino borosilicate glass, or the like; a quartz substrate; a metal substrate; or a plastic substrate which can withstand the process temperature of the manufacturing process is used as a substrate 100. A surface of the substrate 100 may be polished by CMP or the like to be planarized. In addition, an insulating layer may be formed over the substrate 100. The insulating layer is formed of a single layer or a stack of an oxide material or a nitride material containing silicon by a method such as CVD, sputtering, or spin coating. Although the insulating layer is not necessarily formed, it has an effect of blocking contaminants or the like from the substrate 100.

A gate electrode layer 103 and a gate electrode layer 104 are formed over the substrate 100. The gate electrode layers 103 and 104 can be formed by CVD, sputtering, a droplet discharge method, or the like. The gate electrode layers 103 and 104 may be formed of an element selected from Ag, Au, Ni, Pt, Pd, Ir, Rh, Ta, W, TI, Mo, Al, or Cu, an alloy material or a compound material containing the element as its main component. Alternatively, a semiconductor film typified by a polycrystalline silicon film doped with an impurity element such as phosphorus, or an AgPdCu alloy may be used. Either a single layer structure or a layered structure may be used. For example, a two-layer structure of a tungsten nitride (WN) film and a molybdenum (Mo) film or a three-layer structure in which a 50 nm thick tungsten film, a 500 nm thick alloy (Al—Si) film of aluminum and silicon, and a 30 nm thick titanium nitride film are stacked in order may be used. Further, in the case of the three-layer structure, tungsten nitride may be used instead of tungsten of the first conductive film, an alloy (Al—Ti) film of aluminum and titanium may be used instead of the alloy (Al—Si) film of aluminum and silicon of the second conductive film, and a titanium film may be used instead of the titanium nitride film of the third conductive film.

In the case where the gate electrode layers 103 and 104 are required to be processed into certain shape, they may be each processed into a desired shape by dry etching or wet etching after forming a mask. The electrode layers can be each etched to have a tapered shape by ICP (Inductively Coupled Plasma) etching by appropriately controlling the etching condition (the amount of electric power applied to a coiled electrode, the amount of electric power applied to an electrode of a substrate side, the temperature of the electrode of the substrate side, or the like). Note that a chlorine-based gas typified by $Cl_2$, $BCl_3$, $SiCl_4$, $CCl_4$ or the like; a fluorine-based gas typified by $CF_4$, $SF_6$, $NF_3$, or the like; or $O_2$ can be appropriately used for the etching gas.

A mask for processing into a desired shape can be formed by selectively discharging a composition. When the mask is selectively formed in such a way, simplification of the step of processing can be achieved. A resin material such as epoxy resin, phenol resin, novolac resin, acrylic resin, melamine resin, or urethane resin is used for the mask. In addition, the mask may be formed by a droplet discharge method using an organic material such as benzocyclobutene, parylene, fluorinated-arylene-ether, or permeable polyimide; a compound material made by the polymerization of a siloxane-based polymer or the like; a composition material containing a water-soluble homopolymer and a water-soluble copolymer, or the like. Alternatively, a commercial resist material containing a photosensitizer may be used. For example, a typical positive type resist such as novolac resin or naphthoquinone diazide compound that is a photosensitizer, or a negative type resist such as a base resin, diphenylsilanediol, or an acid generator may be used. In using whichever material, the surface tension and the viscosity are appropriately adjusted by controlling the concentration of a solvent or adding a surfactant or the like.

The gate electrode layers 103 and 104 may be formed by forming a conductive film and thereafter processing the conductive film into a desired shape using mask layers Subsequently, a gate insulating layer 114 is formed over the gate electrode layers 103 and 104. The gate insulating layer 114 can be formed with a single layer or a stack of a material such as a silicon oxide material or a silicon nitride material. In this embodiment mode, a two-layer structure of a silicon nitride film and a silicon oxide film is used. Alternatively, the gate insulating layer 114 may have a single layer of a silicon oxynitride film or three or more layers of a silicon oxynitride film, a silicon nitride film, and a silicon oxide film. Preferably, a dense silicon nitride film is used. When using silver, copper or the like for the conductive layers formed by a droplet discharge method, diffusion of impurities is prevented and the surfaces are planarized by forming a silicon nitride film or an NiB film thereover as a barrier film. In order to form a dense insulating film with less gate leakage current at a low temperature, a reactive gas containing a rare gas element such as argon may be used to mix the rare gas element into the insulating film to be formed.

Next, a semiconductor layer is formed. A semiconductor layer having one conductivity type may be formed if necessary. An NMOS structure of an n-channel TFT provided with an n-type semiconductor layer, a PMOS structure of a p-channel TFT provided with a p-type semiconductor layer, and a CMOS structure of an n-channel TFT and a p-channel TFT can be manufactured. An n-channel TFT or a p-channel TFT can be formed by making an impurity region in a semiconductor layer by adding an element which imparts conductivity by doping for imparting conductivity. The conductivity may be imparted to a semiconductor layer by a plasma treatment using $PH_3$ gas instead of forming the n-type semiconductor layer.

An amorphous semiconductor (hereinafter also referred to as an "AS") manufactured by a vapor phase growth method or sputtering using a gas of a semiconductor material typified by silane or germane; a polycrystalline semiconductor that is formed by crystallizing the amorphous semiconductor by utilizing light energy or thermal energy; a semiamorphous (also referred to as microcrystalline or microcrystal) semiconductor (hereinafter also referred to as a "SAS"); or the like can be used as a material for forming the semiconductor layer. The semiconductor layer can be formed by a means of various methods (sputtering, LPCVD, plasma CVD, or the like).

The SAS is a semiconductor having an intermediate structure between an amorphous structure and a crystalline structure (including a single crystal and a polycrystal) and having a third state which is stable in terms of free energy, and includes a crystalline region having short-range order and lattice distortion. A crystalline region of 0.5 nm to 20 nm can be observed in at least a part of the film. When silicon is contained as the main component, a Raman spectrum is shifted to a lower wavenumber than 520 $cm^{-1}$. A diffraction peak of (111) or (220) to be caused by a silicon crystal lattice is observed in X-ray diffraction. Hydrogen or halogen of at least 1 atomic % or more is contained to terminate a dangling bond. The SAS is formed by glow discharge decomposition (plasma CVD) of a silicon source gas. $SiH_4$ is used as a silicon source gas. Alternatively, $Si_2H_6$, $SiH_2Cl_2$, $SiHCl_3$, $SiCl_4$, $SiF_4$, or the like can also be used as the silicon source gas. Further, $F_2$ or $GeF_4$ may be mixed. This silicon source gas may be diluted with $H_2$, or $H_2$ and one or more rare gas elements selected from He, Ar, Kr, and Ne. The dilution ratio ranges from 1:2 to 1:1000. The pressure ranges approximately from 0.1 Pa to 133 Pa, and the power frequency ranges from 1 MHz to 120 MHz, preferably from 13 MHz to 60 MHz. The substrate heating temperature is preferably 300° C. or less, and the film can still be formed at a temperature from 100° C. to 200° C. It is desirable that an atmospheric constituent impurity such as oxygen, nitrogen, or carbon is $1\times10^{20}$ $cm^{-3}$ or less as an impurity element taken in the film forming step; specifically, the oxygen concentration is $5\times10^{19}$ $cm^{-3}$ or less, preferably $1\times10^{19}$ $cm^{-3}$ or less.

A favorable SAS can be obtained by further promoting lattice distortion by adding a rare gas element such as helium, argon, krypton, or neon to enhance stability. Additionally, as a semiconductor layer, a SAS layer formed using a hydrogen-based gas may be formed over a SAS layer formed using a fluorine-based gas.

An amorphous semiconductor is typified by hydrogenated amorphous silicon, and a crystalline semiconductor is typified by polysilicon or the like. Polysilicon (polycrystalline silicon) includes a high-temperature polysilicon which is formed under a process temperature of 800° C. or more, a low-temperature polysilicon which is formed under a process temperature of 600° C. or less, polysilicon that is crystallized by adding an element or the like which promotes crystallization, or the like. Naturally, as described above, semiamorphous semiconductor or a semiconductor which includes a crystalline phase in a portion may be used.

As a material of the semiconductor, other than an element of silicon (Si), germanium (Ge), or the like, a compound semiconductor such as GaAs, InP, SiC, ZnSe, GaN, or SiGe can be used. In addition, zinc oxide (ZnO) can also be used. In the case of using ZnO for the semiconductor layer, a single layer or a stack of $Y_2O_x$, $Al_2O_3$, and $TiO_2$ is preferably used as the gate insulating layer, and ITO, Au, Ti, or the like is preferably used for the gate electrode layer, a source electrode layer, or a drain electrode layer. In addition, In, Ga, or the like can be added into ZnO.

In the case where a crystalline semiconductor layer is used as the semiconductor layer, various methods (a laser crystallization method, a thermal crystallization method, a thermal crystallization method using an element promoting crystallization such as nickel, or the like) may be employed as a method of manufacturing the crystalline semiconductor layer. A microcrystalline semiconductor, which is a SAS, can be crystallized by being irradiated with laser light to improve the crystallinity. In the case where an element promoting crystallization is not introduced, hydrogen is released until hydrogen concentration contained in an amorphous semiconductor film becomes $1\times10^{20}$ $atoms/cm^3$ or less by heating the amorphous semiconductor film at a temperature of 500° C. for one hour in a nitrogen atmosphere before irradiating the amorphous semiconductor film with laser light. This is because the amorphous semiconductor film containing much hydrogen is damaged when the film is irradiated with laser light.

Any method can be used for introducing a metal element into the amorphous semiconductor layer as long as the method is capable of making the metal element exist on the surface of or inside the amorphous semiconductor layer. For example, sputtering, CVD, a plasma treatment method (including plasma CVD), an adsorption method, or a method for applying a metal salt solution can be employed. Among them, the method using a solution is simple, easy, and advantageous in terms of concentration control of the metal element. It is preferable to form an oxide film by UV light irradiation in an oxygen atmosphere, a thermal oxidation method, a treatment with ozone water or hydrogen peroxide including a hydroxyl radical, or the like in order to improve wettability of the surface of the amorphous semiconductor layer and to spread the aqueous solution over the entire surface of the amorphous semiconductor layer.

Heat treatment and laser light irradiation may be combined to crystallize the amorphous semiconductor layer. Alternatively, one of the heat treatment and the laser light irradiation may be performed plural times.

In addition, a crystalline semiconductor layer may be directly formed over the substrate by a linear plasma method. Alternatively, a crystalline semiconductor layer may be selectively formed over the substrate by using the linear plasma method.

A semiconductor layer can be formed by a printing method, a dispenser method, a spray method, a spin coating method, a droplet discharge method, or the like using an organic semiconductor material. In this case, since the above etching steps are not required, the number of steps can be reduced. A low molecular weight material, a high molecular weight material, or the like is used for the organic semiconductor, and in addition, a material such as an organic pigment or a conductive high molecular weight material can be used. A π-electron conjugated high molecular weight material having a skeleton constituted by conjugated double bonds is preferably used as the organic semiconductor material used in the present invention. Typically, a soluble high molecular weight material such as polythiophene, polyfluoren, poly(3-alkylthiophene), a polythiophene derivative, or pentacene can be used.

A material, which can be treated after the deposition of a soluble precursor to form a semiconductor layer, may be used as another organic semiconductor material applicable to the present invention. Polythienylenevinylene, poly(2,5-thienylenevinylene), polyacetyrene, a polyacetyrene derivative, polyallylenevinylene, or the like can be used as such an organic semiconductor material.

In converting the precursor into an organic semiconductor, a reaction catalyst such as a hydrogen chloride gas is added in addition to performing a heat treatment. The following can be employed as a typical solvent which dissolves the soluble organic semiconductor material: toluene, xylene, chlorobenzene, dichlorobenzene, anisole, chloroform, dichloromethane, y butyl lactone, butyl cellosolve, cyclohexane, NMP (N-methyl-2-pyrrolidone), cyclohexanone, 2-butanone, dioxane, dimethylformamide (DMF), THF (tetrahydrofuran), or the like.

A semiconductor layer 105 and a semiconductor layer 106 are formed over the gate insulating layer 114. In this embodiment mode, amorphous semiconductor layers are crystallized as the semiconductor layers 105 and 106 to form crystalline semiconductor layers. In the crystallizing step, the amorphous semiconductor layers are doped with an element which promotes crystallization (also referred to as a catalytic element or a metal element), and a heat treatment (at a temperature of 550° C. to 750° C. for 3 minutes to 24 hours) is performed to crystallize the amorphous semiconductor layer. As the element promoting the crystallization, one or more of elements selected from iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used. In this embodiment mode, nickel is used.

In order to remove the element which promotes crystallization in the crystalline semiconductor layer, a semiconductor layer containing an impurity element is formed in contact with the crystalline semiconductor layer and used as a gettering sink. The impurity element may be an impurity element imparting n-type conductivity, an impurity element imparting p-type conductivity, a rare gas element, or the like. For example, one or more of elements selected from phosphorus (P), nitrogen (N), arsenic (As), antimony (Sb), bismuth (Bi), boron (B), helium (He), neon (Ne), argon (Ar), krypton (Kr), and xenon (Xe) can be used. In this embodiment mode, a semiconductor layer containing argon is formed as the semiconductor layer containing the impurity element which functions as a gettering sink. The semiconductor layer containing argon is formed over the crystalline semiconductor layer containing the element which promotes crystallization, and a heat treatment (at a temperature of 550° C. to 750° C. for 3 minutes to 24 hours) is performed. The element promoting crystallization in the crystalline semiconductor layer moves into the semiconductor layer containing argon, and the element promoting crystallization in the crystalline semiconductor layer is removed or reduced. Then, the semiconductor layer containing argon, which functions as a gettering sink, is removed. An n-type semiconductor layer containing phosphorus (P), which is an impurity element imparting n-type conductivity, is formed over the crystalline semiconductor layer. The n-type semiconductor layer functions as a source or drain region. In this embodiment mode, an n-type semiconductor layer is formed using a semiamorphous semiconductor. The semiconductor layers and the n-type semiconductor layer formed through the above steps are processed into desired shapes to form the semiconductor layers 105 and 106 and an n-type semiconductor layer. Through a later step, the n-type semiconductor layer becomes an n-type semiconductor layer 105a and an n-type semiconductor layer 105b. When the mask layers used for processing the semiconductor layers and the n-type semiconductor layer are formed by a droplet discharge method, the wave shape is reflected in the shape of the semiconductor layers.

A mask formed with an insulator such as a resist or polyimide is formed by using a droplet discharge method. A through hole is formed in a part of the gate insulating layer 114 by etching using the mask, and a part of the gate electrode layer 104 disposed in the lower layer is exposed. Although either plasma etching (dry etching) or wet etching may be used for the etching, plasma etching is suitable to treat a large substrate. A fluorine-based gas such as $CF_4$, $NF_3$, or a chlorine-based gas such as $Cl_2$ or $BCl_3$ may be used as the etching gas, and an inert gas such as He or Ar may be appropriately added. In addition, a local electrical discharge process can be performed when an atmospheric pressure discharge etching process is applied, and a mask layer need not be entirely formed over the substrate.

A mask used for processing to form the through hole can be formed by selectively discharging a composition. Thus formed mask makes it possible to simplify the process of patterning. A resin material such as epoxy resin, acrylic resin, phenol resin, novolac resin, melamine resin, or urethane resin can be used. In addition, the mask may be formed by a droplet discharge method using an organic material such as benzocyclobutene, parylene, fluorinated-arylene-ether, or light-transmitting polyimide; a compound material made by polymerization, such as a siloxane-based polymer; a composite material containing a water-soluble homopolymer and a water-soluble copolymer; or the like. Alternatively, a commercial resist material containing a photosensitizer may be used. For example, a typical positive type resist such as a novolac resin and a naphthoquinone diazide compound that is a photosensitizer, or a negative type resist such as a base resin and diphenylsilanediol and an acid generator may be used. Whichever material is used, the surface tension and the viscosity are appropriately adjusted by controlling the concentration of a solvent or adding a surfactant or the like.

Further, in this embodiment mode, in forming a mask used for processing into a desired shape by a droplet discharge method, wettability of the formation region is preferably controlled in a pretreatment. The wettability and the diameter of a droplet are controlled; thus, a desired shape (line width or the like) can be stably obtained. This process can be employed, in the case of using a liquid material, as a pretreatment for any formed component (such as an insulating layer, a conductive layer, a mask layer, or wiring layer).

A source/drain electrode layer 107, a source/drain electrode layer 108, an electrode layer 109, a source/drain electrode layer 110, and a source/drain electrode layer 111 are formed over an n-type semiconductor layer.

In this embodiment mode, the present invention is applied to power lines 112a, 112b, and 112c. The power lines 112a, 112b, and 112c are formed by a droplet discharge method shown in Embodiment Mode 1 to have a meandering shape. The centerlines of the droplets discharged in a first discharging step and the centerlines of the droplets discharged in a second step are staggered in a line width direction; thus, the meandering shape is obtained. By using such a meandering power line, larger current can be flowed than a straight power line; accordingly, more power can be supplied.

As to a material which is formed to control wettability of the formation region before forming the power lines 112a, 112b, and 112c, a part of the material which remains may be left, or unnecessary part may be removed after forming them. The removal may be conducted by ashing with oxygen, etching, or the like. The power lines 112a, 112b, and 112c can be used as masks.

The semiconductor layers and the n-type semiconductor layer are processed into a desired shape after the source/drain electrode layers 107 and 108, the electrode layer 109, and the source/drain electrode layers 110 and 111 are formed. In this embodiment mode, the semiconductor layers and the n-type semiconductor layer are processed using a mask formed by a droplet discharge method; alternatively, the semiconductor layers and the n-type semiconductor layer may be processed by etching using a source/drain electrode layer as a mask.

As a conductive material for forming the source/drain electrode layers, a composition which mainly contains metal particles of Ag (silver), Au (gold), Cu (copper), W (tungsten), Al (aluminum), Mo (molybdenum), or the like can be used. Alternatively, indium tin oxide (ITO), ITSO containing indium tin oxide and silicon oxide, organoindium, organotin, zinc oxide, titanium nitride, or the like which has light-transmitting properties may be combined.

In the through hole formed in the gate insulating layer 114, the source/drain electrode layer 108 and the gate electrode layer 104 are electrically connected to each other. The electrode layer 109 partially constitutes a capacitor element.

By using a droplet discharge method in combination, material loss can be reduced compared with the formation by coating the entire surface by sputtering or the like; thus, the cost can be reduced. In accordance with the invention, layers can be formed stably even in the case of which wirings and the like are design and arranged to be dense and sophisticate for miniaturizing and thinning.

Then, a first electrode layer 113 is formed over the gate insulating layer 114. Light is emitted from the light emitting element by bottom emission, top emission, or dual emission. When light is emitted from the substrate 100 side, the first electrode layer 113 may be formed by forming a predetermined pattern using a composition including indium tin oxide (ITO), indium tin oxide containing silicon oxide (ITSO), indium zinc oxide (IZO) containing zinc oxide (ZnO), zinc oxide (ZnO), a material in which ZnO is doped with gallium (Ga), tin oxide ($SnO_2$), or the like, and by baking the pattern.

Preferably, the first electrode layer 113 may be formed of indium tin oxide (ITO), indium tin oxide containing silicon oxide (ITSO), zinc oxide (ZnO), or the like by sputtering. It is more preferable to use indium tin oxide containing silicon oxide formed by sputtering using a target of ITO containing silicon oxide of 2 wt % to 10 wt %. Alternatively, a conductive material in which ZnO is doped with gallium (Ga), or an indium zinc oxide (IZO) film formed using a target which contains silicon oxide and in which indium oxide is mixed with zinc oxide (ZnO) of 2 wt % to 20 wt % by weight may be used. After the first electrode layer 113 is formed by sputtering, a mask layer may be formed by a droplet discharge method, and a desired pattern may be formed by etching. In this embodiment mode, the first electrode layer 113 is formed of a light-transmitting conductive material by a droplet discharge method. Specifically, it is formed using indium tin oxide or ITSO made of ITO and silicon oxide.

The first electrode layer 113 can be selectively formed over the gate insulating layer 114 before forming the source/drain electrode layer 111. In this case, the source/drain electrode layer 111 is connected to the first electrode layer 113 by stacking the source/drain electrode layer 111 over the first electrode layer 113 in this embodiment mode. When the first electrode layer 113 is formed before forming the source/drain electrode layer 111, it can be formed over a flat formation region. Accordingly, good coverage can be obtained and polishing treatment such as CMP can be carried out sufficiently. Thus, the first electrode layer 113 can be formed with high planarity.

A structure in which an insulating layer which is to be an interlayer insulating layer is formed over the source/drain electrode layer 111, and in which the insulating layer is electrically connected to the first electrode layer 113 through a wiring layer may be used instead. In this case, an opening (a contact hole) may be formed by forming a material having low wettability on the insulating layer over the source/drain electrode layer 111 instead of removing a part of the insulating layer. When coating with a composition containing an insulating material is carried out by a coating method or the like, the insulating layer is formed in a region except where the low wettability material is formed.

After the insulating layer is solidified by heating or drying, the low wettability material is removed to form an opening. A wiring layer is formed so as to fill the opening, and the first electrode layer 113 is formed so as to be in contact with the wiring layer. In this manner, etching is not required to form the opening, which is effective in simplifying the manufacturing steps.

When a top emission EL display panel is manufactured or in the case of a structure in which generated light is emitted to the side opposite to the substrate 100 side, a composition which mainly contains metal particles of Ag (silver), Au (gold), Cu (copper), W (tungsten), Al (aluminum), or the like can be used. Alternatively, the first electrode layer 113 may be formed by forming a transparent conductive film or a conductive film having light reflectivity by sputtering, forming a mask pattern by a droplet discharge method, and then etching the conductive film.

The first electrode layer 113 may be polished by CMP or by wiping with polyvinyl alcohol-based porous body so that the surface of the first electrode layer 113 is made flat. In addition, after polishing by CMP, ultraviolet irradiation, or oxygen plasma treatment, or the like may be performed on the surface of the first electrode layer 113.

Through the above-mentioned steps, a TFT substrate for a display panel, in which a bottom gate TFT and the first electrode layer 113 are connected over the substrate 100, is completed. The TFT in this embodiment mode is an inverted staggered type.

Subsequently, an insulating layer (also referred to as a partition wall or a bank) 121 is selectively formed. The insulating layer 121 is formed to have an opening over the first electrode layer 113. In this embodiment mode, the insulating layer 121 is formed over the entire surface, and etched into a desired shape by using a mask of a resist or the like. When the insulating layer 121 is formed by a droplet discharge method, a printing method, or a dispenser method by which the insulating layer 121 can be formed directly and selectively, patterning by etching is not necessarily required. The insulating layer 121 can also be formed to have a desired shape by a pretreatment according to the present invention.

The insulating layer 121 can be formed of silicon oxide, silicon nitride, silicon oxynitride, aluminum oxide, aluminum nitride, aluminum oxynitride or another inorganic insulating material; acrylic acid, methacrylic acid, or a derivative thereof; a heat-resistant high molecular weight material such as polyimide, aromatic polyamide, or polybenzimidazole; or an inorganic siloxane-based insulating material, which contains an Si—O—Si bond of a compound formed of a siloxane-based material as a starting material and silicon, oxygen and hydrogen; an organic siloxane-based insulating material in which an organic group such as methyl or phenyl is substituted for hydrogen bound with silicon. The insulating layer 121 may be also formed by using a photosensitive material such as acrylic or polyimide, or a non-photosensitive material. The insulating layer 121 preferably has a curved shape in which a curvature radius changes continuously. Accordingly, the coverage of an electroluminescent layer 122 and a second electrode layer 123 which are formed over the insulating layer 121 is improved.

After forming the insulating layer 121 by discharging a composition by a droplet discharge method, the surface of the insulating layer may be pressed with pressure to be planarized so as to improve its planarity. Irregularities may be reduced by making a roller-shaped object move over the surface, or the surface may be vertically pressed with a flat plate-shaped object. Alternatively, irregularities on the surface may be eliminated with an air knife by softening or melting the surface with a solvent or the like. CMP may also be used for polishing the surface. This step may be carried out for planarizing a surface when irregularities are caused by a droplet discharge method. When the planarity is improved through the step, display unevenness or the like of the display panel can be prevented; therefore, a high-definition image can be displayed.

A light emitting element is formed over the substrate 100 which is a TFT substrate for a display panel.

Before forming the electroluminescent layer 122, moisture in the first electrode layer 113 and the insulating layer 121 or moisture adsorbed to the surface may be removed by performing heat treatment at a temperature of 200° C. under atmospheric pressure. It is preferable to perform heat treatment at a temperature of 200° C. to 400° C., preferably 250° C. to 350° C. under reduced pressure, and to form the electroluminescent layer 122 without exposure to atmospheric air by vacuum deposition or a droplet discharge method which is performed under reduced pressure.

As the electroluminescent layer 122, materials producing light emission of red (R), green (G), and blue (B) are selectively applied by vapor deposition using respective evaporation masks. The materials (low molecular weight materials, high molecular weight materials, or the like) each produce luminescence of red (R), green (G), and blue (B) can be formed by a droplet discharge method in the same manner as a color filter. This is preferable since separate deposition of RGB can be carried out even without using a mask. Then, the second electrode layer 123 is formed over the electroluminescent layer 122 to complete a display device having a display function using a light emitting element. The luminescence may include only light generated in returning back to a ground state from a singlet excited state (fluorescence), or may include only light generated in returning to a ground state from a triplet excited state (phosphorescence). Alternatively, the luminescence may include fluorescence (or phosphorescence) for one color of R, G, and B, and phosphorescence (fluorescence) and for the rest of the two colors; thus, the light emission may be combined.

Phosphorescence may be used for only R and fluorescence may be used for G and B. Specifically, a layered structure having a copper phthalocyanine (CuPc) film provided with a thickness of 20 nm as a hole injection layer and a tris-8-quinolinolato aluminum complex ($Alq_3$) film provided thereover with a thickness of 70 nm as a light emitting layer may be used. Colors of light emission can be controlled by adding a fluorescent dye such as quinacridone, perylene, or DCM 1 into $Alq_3$.

However, the above-mentioned example is one example of the organic light-emitting material that can be used for an electroluminescent layer, and the material is never limited thereto. As the material for the electroluminescent layer, an organic material (including a high/low molecular weight material) or a composite material of an organic material and an inorganic material can be used. An electroluminescent layer (a layer in which carriers move for emitting light and from which light is emitted) may be formed by arbitrarily combining a light-emitting layer, a charge transport layer, or a charge injection layer. For example, an example in which a low molecular weight organic light-emitting material is used as a light-emitting layer is shown in this embodiment mode; however, an intermediate molecular weight organic light-emitting material or a high molecular weight organic light emitting material may be used as well. Throughout this specification, an organic light-emitting material which does not sublimate and a number of molecules of 20 or less or which has a chained molecule length of 10 μm or less is defined as the intermediate molecular weight organic light-emitting material. In addition, as an example of using a high molecular weight organic light-emitting material, a layered structure having a polythiophene (PEDOT) film provided by spin coating with a thickness of 20 nm as the hole injection layer and a paraphenylene-vinylene (PPV) film with a thickness of approximately 100 nm provided thereover as the light emitting layer may be used. In addition, emission wavelength can be selected from red through blue by using a π-conjugated high molecular weight material of PPV. An inorganic material such as silicon carbide can be used for the charge transport layer or the charge injection layer.

Although it is not shown, it is effective to provide a passivation film so as to cover the second electrode layer 123. The passivation film which is provided at the time of assembling a display device may have a single layer structure or a layered structure. As the passivation film, a single layer of an insulating film containing silicon nitride (SiN), silicon oxide ($SiO_2$), silicon oxynitride (SiON), silicon nitride oxide (SiNO), aluminum nitride (AlN), aluminum oxynitride (AlON), aluminum nitride oxide (AlNO) which has more nitrogen content than oxygen content, aluminum oxide, diamond like carbon (DLC), or nitrogen-containing carbon ($CN_x$), or a stack in which the insulating films are combined can be used. For example, a stack of a nitrogen-containing carbon film ($CN_x$) and silicon nitride (SiN) can be used. Alternatively, an organic material, or a stack of high molecular weight materials such as styrene polymer may be used. Further, a siloxane material may also be used.

At this time, it is preferable to use a film having good coverage for the passivation film. A carbon film, particularly a DLC film is effective. A DLC film can be formed at a temperature ranging from room temperature to 100° C.; therefore, a DLC film can be easily formed over an electroluminescent layer having low heat resistance. A DLC film can be formed by a plasma CVD method (typically, RF plasma CVD, microwave CVD, electron cyclotron resonance (ECR) CVD, thermal filament CVD, or the like), a combustion flame method, sputtering, ion beam deposition, laser deposition, or the like. Hydrogen gas and a hydrocarbon-based gas (for example, $CH_4$, $C_2H_2$, $C_6H_6$, or the like) are used as a reactive gas which is used for deposition. The reaction gas is ionized by glow discharge. The ions are accelerated to collide with a cathode applied with negative self bias. A CN film may be formed by using $C_2H_4$ gas and $N_2$ gas as the reactive gas. The DLC film has a high blocking effect on oxygen and can suppress the oxidation of the electroluminescent layer. Accordingly, the electroluminescent layer can be prevented from oxidation during the subsequent sealing process.

As shown in FIG. 14B, a scaling member 136 is formed and sealing is performed with a sealing substrate 140. Then, a flexible wiring substrate may be connected to a gate wiring layer which is formed so as to be electrically connected to the gate electrode layer 103 to electrically connect to the outside. The same applies to a source wiring layer which is formed so as to be electrically connected to the source/drain electrode layer 107.

The substrate 100 having an element is sealed using a sealing substrate 140 with a filler 135 enclosed therebetween. The filler may be enclosed using a dropping method in the same manner as a liquid crystal material. An inert gas such as nitrogen may be introduced between the substrates as a substitute for the filler 135. Further, providing a drying agent inside the display device makes it possible to prevent deterioration of the light emitting element due to moisture. The drying agent may be provided near the sealing substrate 140 or the substrate 100 having an element. Alternatively, the drying agent may be provided in a depression may formed in a region where the sealing member 136 is formed. When the drying agent is placed in a portion which corresponds to a region that does not contribute to display performance such as a driver circuit area or a wiring region of the sealing substrate 140, the aperture ratio is not reduced even if the drying agent is formed of an opaque material. The filler 135 may be mixed with a hygroscopic material so as to also serve as a drying agent. As mentioned above, a display device having a display function using a light emitting element can be completed (FIGS. 14A and 14B).

Moreover, a terminal electrode layer 137 for electrically connecting the inside of the display device to the outside thereof is attached to an FPC 139 using an anisotropic conductive film 138, so that the terminal electrode layer 137 is electrically connected to the FPC 139.

FIG. 14A shows a top view of the display device. As shown in FIG. 14A, a pixel area 150, a scan line driver circuit area 151a, a scan line driver circuit area 151b, and a connection region 153 are sealed between the substrate 100 and the sealing substrate 140 using a sealing member 136. A signal line driver circuit 152 formed of an IC driver is provided over the substrate 100. In the driver circuit area, a thin film transistor 133 and a thin film transistor 134 are formed. In the pixel area, a thin film transistor 101 and a thin film transistor 102 are formed severally.

In this embodiment mode, the case where a light emitting element is sealed with a glass substrate is shown. Scaling is a process for protecting a light emitting element from moisture. Accordingly, any of a method by which a light emitting element is scaled with a cover material, a method by which a light emitting element is sealed with a thermosetting resin or an ultraviolet curable resin, and a method in which a light emitting element is sealed with a thin film of metal oxide, metal nitride, or the like having high barrier properties, can be used. As for the cover material, glass, ceramics, plastics, or metal can be used; however, when light is emitted from the cover material, the cover material needs to transmit light. The cover material is attached to the substrate over which the above-mentioned light emitting element is formed, with a sealing member such as a thermosetting resin or an ultraviolet curable resin, and then the resin is cured by heat treatment or ultraviolet irradiation treatment to form an enclosed space. It is also effective to provide a hygroscopic material typified by barium oxide in the enclosed space. The hygroscopic material may be provided over the sealing member or a partition wall, or the peripheral part so as not to block light emitted from a light emitting element. Further, it is also possible to fill the space between the cover material and the substrate over which the light emitting element is formed with a thermosetting resin or an ultraviolet curable resin. In this case, it is effective to add a hygroscopic material typified by barium oxide into the thermosetting resin or the ultraviolet curable resin.

In this embodiment mode, although a single gate structure of a switching TFT is shown, a multi-gate structure such as a double gate structure may also be employed. In the case where a SAS or a crystalline semiconductor is used as a semiconductor, an impurity region can be formed by adding impurities which impart one conductivity type. In this case, a semiconductor layer may have impurity regions having different impurity concentrations. For example, the semiconductor layer may have a low concentration impurity region in the vicinity of a channel region and a region which is overlapped with a gate electrode layer, and a high concentration impurity region outside thereof.

Figure 16A:
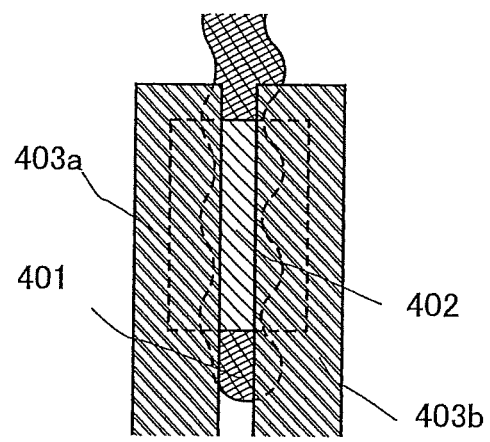
FIGS. 16A and 16B each explain a semiconductor device of the present invention.
Figure 16B:
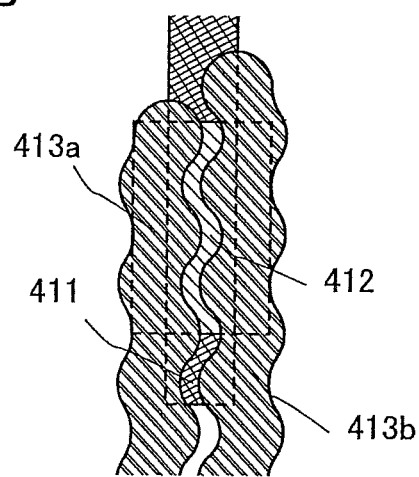

Further, the present invention can be applied to a thin film transistor. FIGS. 16A and 16B each show an example of manufacturing a thin film transistor using a meandering conductive layer as manufactured in Embodiment Mode 1. FIG. 16A shows a thin film transistor having a gate electrode layer 401, a semiconductor layer 402, a source/drain electrode layer 403a, and a source/drain electrode layer 403b. In a thin film transistor shown in FIG. 16A, the present invention is applied to the gate electrode layer 401, and the gate electrode layer 401 is a conductive layer which has a side end having a contiguous wave shape. FIG. 16B shows a thin film transistor having a gate electrode layer 411, a semiconductor layer 412, a source/drain electrode layer 413a, a source/drain electrode layer 413b. In the thin film transistor shown in FIG. 16B, the present invention is applied to the source/drain electrode layer 413a and the source/drain electrode layer 413b. The source/drain electrode layer 413a and a source/drain electrode layer 413b are conductive layers each having a contiguous wave shape on its side end. The source/drain electrode layer 413a and the source/drain electrode layer 413b are stably formed with a spacing therebetween. The present invention may be applied to a semiconductor layer or only one of the source/drain electrode layers in accordance with the required characteristics or shape of the thin film transistor.

As described above, in this embodiment mode, a display panel can be easily manufactured by forming various patterns directly on the substrate using a droplet discharge method even in the case of using a glass substrate of the fifth generation of later, which has 1000 mm or more on a side.

In accordance with the present invention, a desired pattern having necessary functions can be stably formed by fine processing, and the material loss and cost can be reduced. Hence, a display device with high performance and high reliability can be manufactured with high yield.

Embodiment Mode 3

Figure 3:
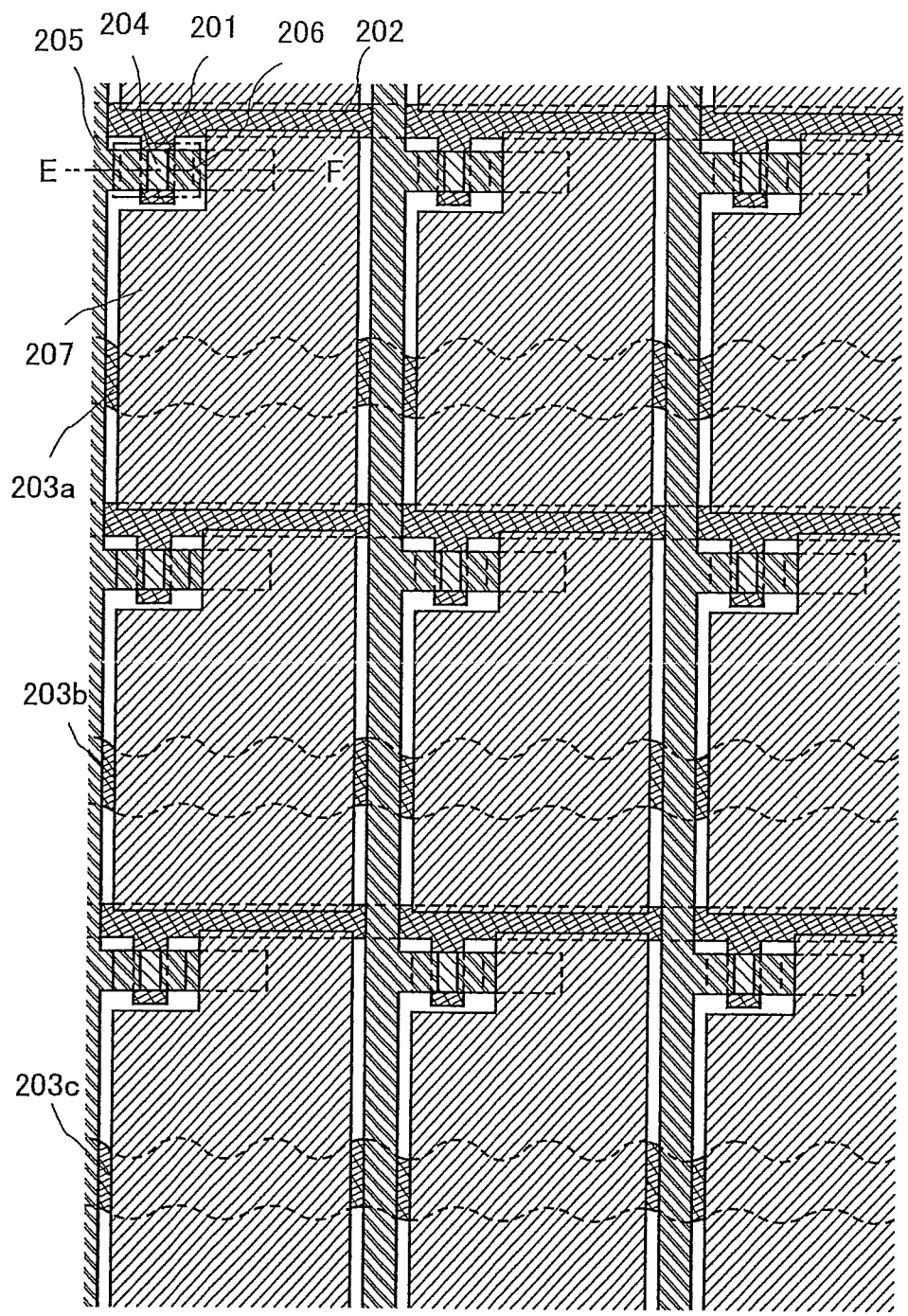
FIG. 3 is a top view of a display device of the present invention.

An embodiment mode of the present invention will be described using FIG. 3 and FIGS. 13A and 13B. Specifically, a method for manufacturing a display device to which the present invention is applied will be described. FIG. 3 is a top view of a pixel area of a display device. FIG. 13B is a cross-sectional view taken along line E-F of FIG. 3. FIG. 13A is also a top view of a display device. FIG. 13B is a cross-sectional view taken along line O-P (including line U-W) of FIG. 13A. Further, in this embodiment mode, an example of a liquid crystal display device in which a liquid crystal material is used for a display element is shown. Therefore, the same portions or portions having the same functions will not be repeatedly explained.

As a substrate 200, a glass substrate such as a barium borosilicate glass substrate, an alumino borosilicate glass substrate, a quartz substrate, a metal substrate, or a heat-resistant plastic substrate that can withstand a processing temperature of the manufacturing process can be used. An insulating layer may be formed over the substrate 200. The insulating layer is formed with an oxide material containing silicon or a nitride material containing silicon by a method such as CVD, plasma CVD, sputtering, or spin coating so as to be a single layer or a laminate. This insulating layer is not needed to be formed. When the insulating layer is formed, it can prevent contaminants from the substrate 200.

A gate electrode layer 202 is formed over the substrate 200. A capacitor wiring layer 203a, a capacitor wiring layer 203b, and a capacitor wiring layer 203c are each formed with a meandering conductive layer using the present invention. The gate electrode layer 202 can be formed by CVD, sputtering, a droplet discharge method, or the like. The gate electrode layer 202 and the capacitor wiring layers 203a, 203b, and 203c may be formed of an element selected from Ag, Au, Ni, Pt, Pd, Ir, Rh, Ta, W, Ti, Mo, Al, and Cu, an alloy material or a compound material containing the above element as its main component. Alternatively, a semiconductor film typified by a polycrystalline silicon film doped with an impurity element such as phosphorus, or an AgPdCu alloy may be used. Either a single layer structure or a layered structure may be used. For example, a two-layer structure of a tungsten nitride (WN) film and a molybdenum (Mo) film, or a three-layer structure in which a tungsten film, an alloy (Al—Si) film of aluminum and silicon, and a titanium nitride film are stacked in order may be used.

In this embodiment mode, a mask layer is formed over a conductive film using a droplet discharge method, and the conductive film is processed into a desired shape, so as to form the capacitor wiring layer 203a, the capacitor wiring layer 203b, and the capacitor wiring layer 203c. Accordingly, as described in Embodiment Mode 1, a mask layer having a meandering shape is formed. The wettability of the surface of the conductive film on a composition containing a mask layer forming material is controlled. The contact angle between the mask layer forming material and the formation region is preferably 20° or more, further preferably, 20° to 40°. In this embodiment mode, a material containing a fluorocarbon chain or a material containing a silane coupling agent is used to control the wettability of the mask layer formation region.

The composition containing the mask layer forming material is discharged with a droplet discharging apparatus to stagger the centerline of the droplets in two steps; thus, a mask layer having a meandering shape. The conductive film is processed into a desired shape using the mask layer to form the capacitor wiring layer 203a, the capacitor wiring layer 203b, and the capacitor wiring layer 203c. More capacitance can be obtained since the capacitor wiring layers each have a meandering shape. Further, since the defects due to shape defects in manufacturing are reduced, the yield can be improved and the productivity can be improved.

In this embodiment mode, after the capacitor wiring layer 203a, the capacitor wiring layer 203b, and the capacitor wiring layer 203c are formed, the mask layer is removed. The capacitor wirings 203a, 203b, and 203c are thereafter irradiated with ultraviolet light; thus, the material containing a fluorocarbon chain or the material containing a silane coupling agent can be decomposed to be removed.

A gate insulating layer 208 is formed, and a semiconductor layer 204, an n-type semiconductor layer 209a, an n-type semiconductor layer 209b, and source/drain electrode layers 205 and 206 are formed; thus, a thin film transistor 201 is formed.

A pixel electrode layer 207 is formed to connect to a source/drain electrode layer 206. The pixel electrode layer 207 can be formed using the same material as the first electrode layer 113 in Embodiment Mode 2. In the case of manufacturing a transmissive liquid crystal display panel, the pixel electrode layer may be formed into a desired shape using a composition containing indium tin oxide (ITO), indium tin oxide having silicon oxide (ITSO), zinc oxide (ZnO), tin oxide ($SnO_2$), or the like by baking the composition.

Subsequently, an insulating layer 261 referred to as an orientation film is formed by a printing method, a dispenser method, or spin coating to cover the pixel electrode layer 207 and the thin film transistor 250. Note that the insulating layer 261 can be selectively formed by using a screen printing method or an offset printing method. Thereafter, rubbing is performed. Then, a sealing member 282 is formed by a droplet discharge method in an area surrounding a region where the pixel is formed.

Subsequently, a counter substrate 266 provided with an insulating layer 263 serving as an orientation film, a color layer 264 serving as a color filter, a conductive layer 265 serving as a counter electrode, and a polarizing plate 267 is attached to the substrate 200 having the TFT with a spacer 281 interposed therebetween. By providing the space with a liquid crystal layer 262, a liquid crystal display device can be manufactured. A polarizing plate 268 is formed also on the side of substrate 200 where any TFT is not provided. A sealing member may be mixed with a filler, and further, the counter substrate 266 may be provided with a shielding film (black matrix) or the like. Note that a dispenser method (a dropping method) or a dip coating method (a pumping method) by which a liquid crystal is injected utilizing a capillary phenomenon after attaching the counter substrate 266 can be used as a method of forming the liquid crystal layer.

The spacer may be provided by dispersing particles of several micrometers; however, in this embodiment, the spacer is provided by forming a resin film over the entire surface of the substrate and processing it into a desired shape. After coating the substrate with such a spacer material using a spinner, the spacer material is formed into a predetermined pattern by light exposure and developing treatment. Further, the pattern is cured by heating at a temperature of 150° C. to 200° C. with a clean oven or the like. The spacer manufactured in this manner can have a different shape depending on the condition of the light exposure or the developing treatment. It is preferable that the spacer have a pillar shape with a flat top portion since the mechanical strength as a liquid crystal display device can be secured when the counter substrate is attached to the substrate. The shape of the spacer is not specifically limited, and it may have a shape of a circular cone or a pyramid.

A connection portion is formed to connect the inside of the display device formed through the above steps and an external wiring substrate. The insulating layer in the connection portion is removed by ashing treatment using oxygen gas under atmospheric pressure or pressure close to the atmospheric pressure. This treatment is performed by using an oxygen gas and one or more gases of hydrogen, $CF_4$, $NF_3$, and $CHF_3$. In this step, the ashing treatment is performed after sealing with the counter substrate to prevent damage or destruction due to static electricity. However, the ashing treatment may be performed at any timing when there are few effects of static electricity.

Subsequently, a terminal electrode layer 287 which is electrically connected to the pixel area is provided with an FPC 286 which is a wiring substrate for connection with an anisotropic conductive layer 285 interposed therebetween (see FIG. 13B). The FPC 286 has a function of transmitting a signal or an electric potential from the outside. Through the above-mentioned steps, a liquid crystal display device having a display function can be manufactured.

FIG. 13A is a top view of the liquid crystal display device. As shown in FIG. 13A, a pixel area 290 and scan line driver regions 291a and 291b are sealed between the substrate 200 and the counter substrate 280 with the sealing member 282, and a signal line driver circuit 292 formed of an IC driver is provided over the substrate 200. A driver circuit having thin film transistors 283 and 284 is provided in a driver area.

Since the thin film transistor 283 is an n-channel thin film transistor and the thin film transistor 284 is a p-channel thin film transistor, a CMOS circuit including the thin film transistors 283 and 284 is provided as a peripheral driver circuit in this embodiment mode.

In this embodiment, a CMOS structure is used in a driver circuit region so as to obtain a function of an inverter. In the case of using only a PMOS structure or an NMOS structure, gate electrode layers of a part of TFTs are connected to each source or drain electrode layer.

In this embodiment, although a switching TFT has a single gate structure, it may have a double gate structure or a multi-gate structure. In the case where a semiconductor is manufactured using a SAS or a crystalline semiconductor, an impurity region can be formed by adding an impurity which imparts one conductivity type. In this case, the semiconductor layer may have impurity regions having different impurity concentrations. For example, the semiconductor layer may have a low concentration impurity region in the vicinity of a channel region and a region which overlaps a gate electrode layer, and may have a high concentration impurity region outside thereof.

As described above, in this embodiment, by forming various kinds of conductive layers and insulating layers directly over a substrate using a droplet discharge method, a display panel can be easily manufactured even in the case of using a glass substrate of the fifth generation or later, which has a side of 1000 mm or more.

In accordance with the present invention, a desired conductive layer and an insulating layer having necessary functions can be stably formed by fine processing, and the material loss and cost can be reduced. Hence, a display device with high performance and high reliability can be manufactured with high yield.

Embodiment Mode 4

In this embodiment mode, an example of an IPS (In-Plane-Switching) mode liquid crystal display device using the present invention will be shown.

The liquid crystal display module can employ a TN (Twisted Nematic) mode, an IPS (In-Plane-Switching) mode, an MVA (Multi-domain Vertical Alignment) mode, an ASM (Axially Symmetric aligned Micro-cell) mode, an OCB mode, or the like.

Figure 8:
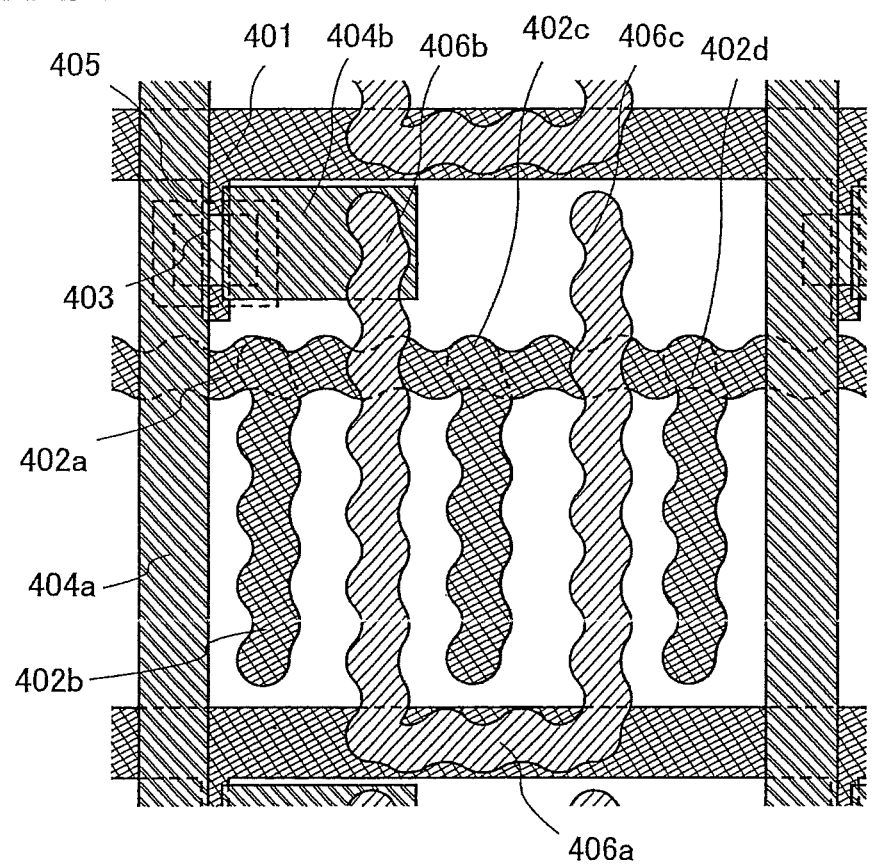
FIG. 8 explains a protective circuit using the present invention.

With respect to the IPS mode, liquid crystal molecules over a substrate are rotated and arranged almost in parallel to a substrate by applying an electric field parallel to the substrate surface. Thus, it is excellent in viewing angle. FIG. 8 shows a top view of a liquid crystal display device of this embodiment mode.

The liquid crystal display device of FIG. 8 includes a gate electrode layer 401, a common electrode layer 402a, a common electrode layer 402b, a common electrode layer 402c, a semiconductor layer 403, a source/drain electrode layer 404a, a source/drain electrode layer 404b, a thin film transistor 405, a pixel electrode layer 406a, a pixel electrode layer 406b, and pixel electrode layer 406c.

The common electrode layers 402a, 402b, and 402c are continuously formed. Meanwhile, the pixel electrode layer 406a, 406b, and 406c are also formed continuously. In this embodiment mode, the present invention is applied to the common electrode layers and the pixel electrode layers. Accordingly, the common electrode layers 402a, 402b, and 402c and the pixel electrode layer 406a, 406b, and 406c are formed by a droplet discharge method as shown in Embodiment Mode 1, and they have continuous wave shape on the side ends.

When the side end has a continuous wave shape, the electric field directions of above and below a folding point are different; thus, the rotation directions of the liquid crystal molecules are different. Accordingly, the viewing angle is improved. The shapes of the common electrode layers and the pixel electrode layers of this embodiment mode can be manufactured by fine processing, which is more effective for improving the viewing angle. Further, material loss is less, and the cost can be reduced. Thus, a display device with high performance and high reliability can be manufactured with high yield.

Embodiment 5

An example of a protective circuit using the present invention will be described.

As shown in FIGS. 6A and 6B, a protective circuit 2713 can be formed between an external circuit and an internal circuit. The protective circuit includes a one or more elements selected from a TFT, a diode, a resistor element, a capacitor element, or the like. The protective circuit is provided so that a rapid change in the potential is prevented; thus, destruction of or damage to the element can be prevented. The reliability is improved accordingly.

As for the protective circuit formed in this embodiment mode, the present invention is applied to forming a part of a wiring layer to have a meandering shape. An example of a wiring layer of a protective circuit manufactured in this embodiment mode will be described with reference to FIGS. 7A to 7C.

Figure 7A:
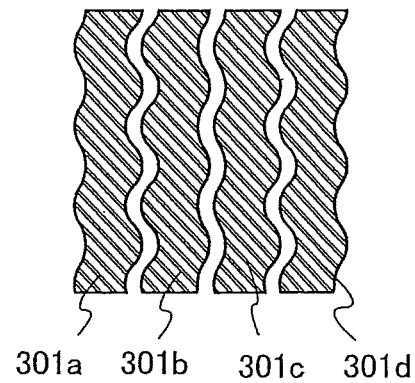
FIGS. 7A to 7C each explain a method for manufacturing a display device of the present invention.
Figure 7B:
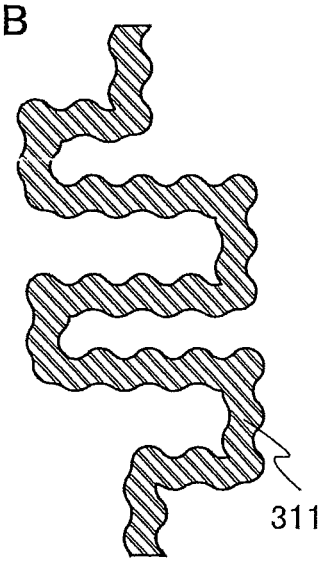
Figure 7C:
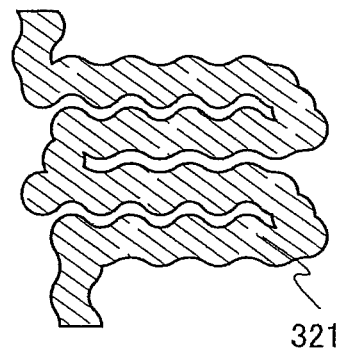

FIGS. 7A, 7B, and 7C each show a wiring layer is winding and having a meandering shape. Wiring layers 301a, 301b, 301c, and 301d in FIG. 7A has a meandering shape and are adjacent to each other with regular spacing therebetween as described in Embodiment Mode 1.

FIGS. 7B and 7C respectively show wiring layers 311 and 321 which have meandering shapes themselves and have projections and depressions on the ends. Further, the wiring layers are rectangular. When the wiring layers are provided with rectangular shapes, capacitance is formed between the wiring layers. The amount of the capacitance can be determined by appropriately controlling the distance between the wiring layers as shown in FIGS. 7B and 7C.

When wiring layers have a meandering shape and are rectangular with folding portions, the resistance of the wiring layers can be increased and they can serve as protective circuits.

Faults such as electrostatic discharge damage to a semiconductor device can be prevented by blocking electricity. A protective circuit is not limited to this embodiment mode, and a TFT, a capacitor, a diode or the like may be used in combination. With the use of a protective circuit, the reliability of a semiconductor device can be further improved.

This embodiment mode can be combined with any one of Embodiment Modes 1 to 4.

Embodiment Mode 6

A television device can be completed by using a display device manufactured in accordance with the present invention. A television device can be completed by incorporating a liquid crystal display module using a liquid crystal which shown in Embodiment Mode 3 or an EL display module using an EL element which is shown in Embodiment Mode 2 into a chassis as shown in FIGS. 9A and 9B. When the EL display module is used, an EL television device can be obtained. When using a liquid crystal display module, a liquid crystal television device can be obtained. A main screen 2003 is formed with the display module, and a speaker portion 2009, an operation switch, and the like are provided as its accessory equipment. Thus, a television device can be completed in accordance with the present invention.

A display panel 2002 is incorporated in a chassis 2001, and general TV broadcast can be received with a receiver 2005. By connecting to a communication network by wireline or wireless connection via a modem 2004, one-way (from a sender to a receiver) or two-way (between a sender and a receiver or between receivers) information communication can be carried out. The television device can be operated by using a switch built in the chassis 2001 or a remote control unit 2006. A display portion 2007 for displaying output information may also be provided in the remote control unit 2006.

Further, the television device may include a sub screen 2008 formed using a second display panel to display channels, volume, or the like, in addition to the main screen 2003. In this structure, the main screen 2003 may be formed by using an EL display panel having wide viewing angle, and the sub screen 2008 may be formed by using a liquid crystal display panel capable of displaying images with lower power consumption. In order to reduce the power consumption preferentially, the main screen 2003 may be formed by using a liquid crystal display panel, and the sub screen may be formed by using an EL display panel, which can blink. In accordance with the present invention, a highly reliable display device can be manufactured even when a large substrate is used and a large number of TFTs or electronic parts are used.

FIG. 9B shows a television device having a large display portion, for example, with a size of 20 inches to 80 inches. The television device includes a chassis 2010, a display portion 2011, a remote control unit 2012 that is an operation portion, a speaker portion 2013, and the like. The present invention is applied to manufacturing of the display portion 2011. Since the television device in FIG. 9B is a wall-hanging type, it does not require a large installation space.

Naturally, the invention is not limited to the television device, and can be applied to various uses; for example, a large-area display medium such as an information display board in a train station, an airport, or the like, or an advertisement display board on the street, as well as a monitor of a personal computer Embodiment Mode 7

By implementing the present invention, various kinds of display devices can be manufactured. In other words, various kinds of electronic devices can be manufactured by incorporating such display devices of the invention in display portions of the electronic devices.

Examples of the electronic devices include a camera such as a video camera or a digital camera; a projector, a head-mounted display (a goggle type display); a car navigation system; a mobile stereo; a personal computer; a game machine; a portable information terminal (such as a mobile computer, a cellular phone, or an electronic book); an image reproducing device provided with a recording medium (concretely, a device which can reproduce contents of the recording medium such as a digital versatile disc (DVD) and includes a display portion capable of displaying images thereof); and the like. Specific examples thereof are shown in FIGS. 10A to 10D.

Figure 10A:
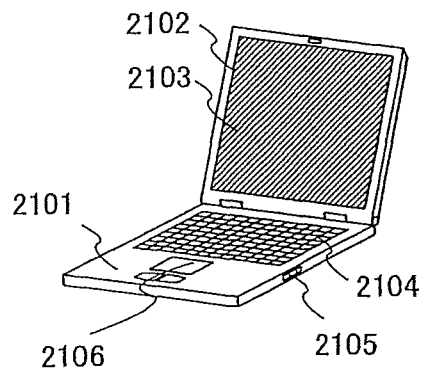
FIGS. 10A to 10D each show an electronic device using the present invention.

FIG. 10A shows a personal computer, which includes a main body 2101, a chassis 2102, a display portion 2103, a keyboard 2104, an external connection port 2105, a pointing mouse 2106, and the like. The display portion 2103 can be manufactured using the invention. In accordance with the invention, a highly reliable personal computer in which a high-quality image can be displayed on the display portion 2103 can be manufactured even if the personal computer is miniaturized and a wiring or the like becomes more sophisticated.

Figure 10B:
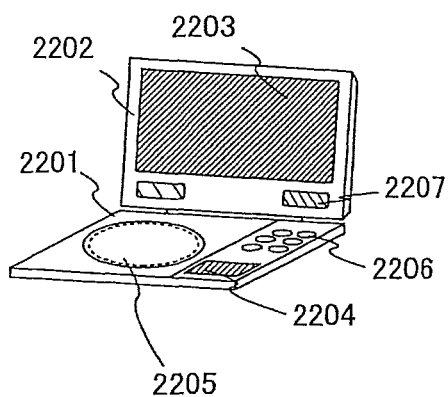

FIG. 10B shows an image reproducing device (specifically, a DVD reproducing device) including a recording medium, which includes a main body 2201, a chassis 2202, a display portion A 2203, a display portion B 2204, a recording medium (a DVD or the like) reading portion 2205, an operation key 2206, a speaker portion 2207, and the like. The display portion A 2203 mainly displays image information, while the display portion B 2204 mainly displays text information. These display portion A 2203 and display portion B 2204 can be manufactured using the invention. In accordance with the invention, a highly reliable image reproducing device in which a high-quality image can be displayed on the display portions can be manufactured even if the image reproducing device is miniaturized and a wiring or the like becomes more sophisticated.

Figure 10C:
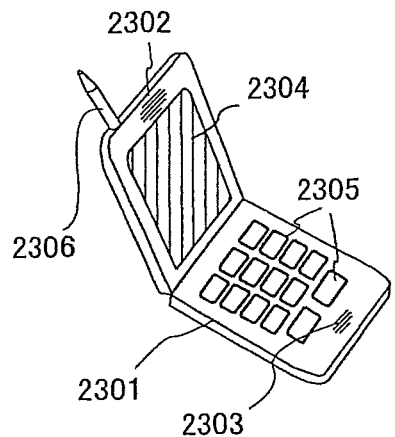

FIG. 10C shows a cellular phone, which includes a main body 2301, an audio output portion 2302, an audio input portion 2303, a display portion 2304, operation switches 2305, an antenna 2306, and the like. By applying the display device manufactured using the present invention to the display portion 2304, a highly reliable cellular phone in which a high-quality image can be displayed on the display portion 2304 can be manufactured even if the cellular phone is miniaturized and a wiring or the like becomes more sophisticated.

Figure 10D:
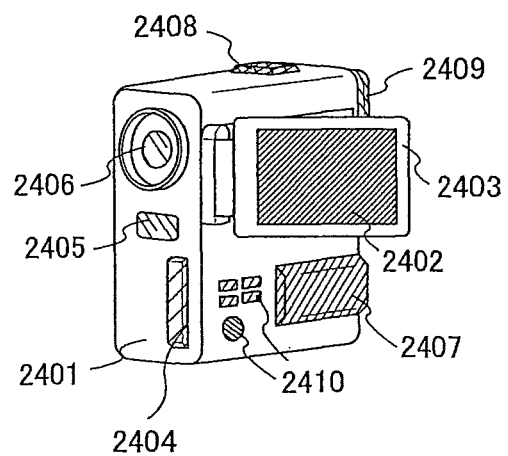

FIG. 10D shows a video camera, which includes a main body 2401, a display portion 2402, a chassis 2403, an external connection port 2404, a remote control receiver 2405, an image receiving portion 2406, a battery 2407, an audio input portion 2408, an eye piece portion 2409, operation keys 2410, and the like. The display portion 2402 can be manufactured using the invention. By applying the display device manufactured using the invention to the display portion 2402, a highly reliable video camera in which a high-quality image can be displayed on the display portion 2402 can be manufactured even if the video camera is miniaturized and a wiring or the like is formed precisely. This embodiment mode can be freely combined with any of the above described embodiment modes.

Embodiment Mode 8

In this embodiment mode, in a chip including a processor circuit such as a wireless chip, a wireless tag, a wireless IC, an RFID tag, or an IC tag; an example of using a conductive layer according to the invention for an antenna for wireless data reception or transmission, or duplex wireless data reception or transmission will be described.

Figure 5A:
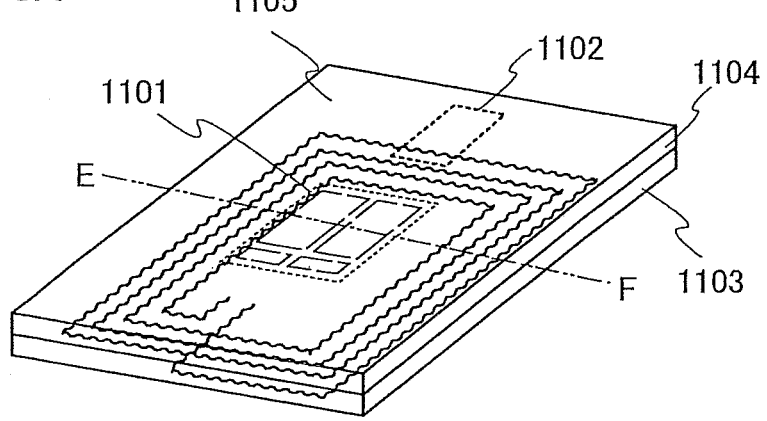
FIGS. 5A and 5B each explain a semiconductor device of the present invention.

In FIG. 5A, one mode of a chip which is one of semiconductor devices according to the invention is shown in a perspective view. A processor which is an aggregate having various signal processing functions or a system processor having a processor as a system can be used as an integrated circuit. Reference numeral 1101 denotes an integrated circuit, 1105 denotes an antenna, and the antenna 1105 is connected to the integrated circuit 1101. Reference numeral 1103 denotes a support which also serves as a cover material, 1104 denotes a cover material. The integrated circuit 1101 and the antenna 1105 are formed over the support 1103, and the cover material 1104 is overlapped with the support 1103 so as to cover the integrated circuit 1101 and the antenna 1105. Note that the cover material 1104 may not necessarily be used; however, when the integrated circuit 1101 and the antenna 1105 are covered with the cover material 1104, mechanical strength of the chip including a processor circuit can be increased.

A thin film transistor, a memory element, a diode, a photoelectric conversion element, a resistor, a coil, a capacitor element, an inductor, or the like can be used for a semiconductor element used for the integrated circuit 1101.

As for the integrated circuit 1101, a protective film is provided at an upper portion or between the support 1103 and the integrated circuit 1101, so that the integrated circuit 1101 is not contaminated with moisture or the like; thus, a chip including a processor circuit with improved reliability can be provided. A film having a barrier function, such as a silicon nitride film can be used for the protective film.

Figure 5B:
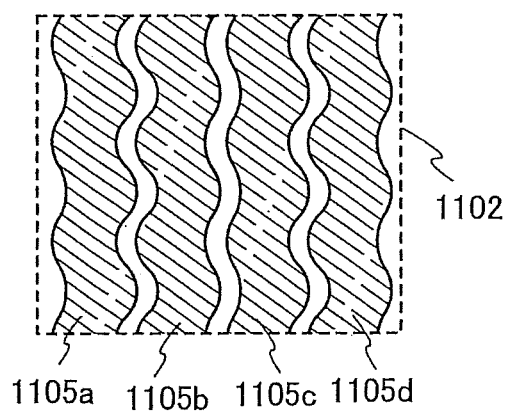

FIG. 5B shows an enlarged top view of a region 1102 in the antenna 1105. An antenna 1105a, an antenna 1105b, an antenna 1105c, and an antenna 1105d are adjacently provided in the region 1102. The antennas 1105a to 1105d are manufactured by a droplet discharge method in a manner described in Embodiment Mode 1, to have a shape meandering to the right and left. Thus, the centerline of the droplets discharged in the first step and the centerline of the droplets discharged in the second step are displaced in a line width direction. The adjacent antennas 1105a to 1105d can be stably formed with a desired shape with uniform spacing therebetween. Thus formed antennas 1105a to 1105d can be used to manufacture a semiconductor device with high reliability without electrical characteristics faults due to defects of shape. By forming the antennas by a droplet discharge method, the number of steps can be reduced and the corresponding cost can be reduced.

The characteristics of an antenna depends on the form of the antenna. Electromotive force generated when an antenna resonates with a reader/writer depends on the frequency, the number of windings, area, and the like of a coil of an antenna. The resonance frequency which is a frequency at which the electromotive force is large depends on the inductance and capacitance of a coil. Because the inductance of a coil depends on a form of the coil, such as size, shape, the number of windings, and distance between adjacent coils. In accordance with the present invention, the shape of the antenna can be processed more finely; thus, the flexibility and selectivity of the shape of an antenna can be improved. Thus, a semiconductor device having characteristics corresponding to the required functions can be manufactured.

In this embodiment mode, an example of attaching a stack of integrated circuit and an antenna formed over an interlayer insulating film of the integrated circuit, using a cover material, has been described. The invention is not limited thereto, and a cover material provided with an antenna may be secured an integrated circuit with an adhesive material. At that time, UV treatment or supersonic treatment is conducted using an anisotropic conductive adhesive material or an anisotropic conductive film to attach the integrated circuit and the antenna. The present invention is not limited to the method, and various methods can be used. Further, the antenna is not necessarily has the same size as the chip including a processor circuit, and the size may be appropriately set to be larger or smaller than the chip.

Alternatively, the integrated circuit may be formed directly on a support and covered with a dense film of silicon nitride or the like as a cover film, or the integrated circuit may be formed and thereafter attached to the support and a cover material. The support and the cover material can be formed of a flexible material such as plastic, an organic resin, paper, fiber, carbon graphite, or the like. By using a biodegradable resin for a cover material, it is decomposed by bacteria, and it is returned to soil. Since the integrated circuit of this embodiment mode includes silicon, aluminum, oxygen, nitrogen, or the like, a nonpolluting ID chip can be formed. Additionally, a used chip including a processor circuit can be burnt up or cut in the case of using an incineration nonpolluting material such as paper, fiber, carbon graphite for a cover material. A chip including a processor circuit using these materials does not generate a poisonous gas even when it is burnt up; thus, it is nonpolluting.

When an integrated circuit formed through a peeling process is attached to a support or a cover material, it is preferable to form the integrated circuit sandwiched between the support and the cover material to a thickness of 5 µm or less, more preferably, 0.1 µm to 3 µm. Additionally, when the total thickness of the support and the cover material is denoted by d, each thickness of the support and the cover material is preferably (d/2)±30 µm, more preferably, (d/2)±10 µm. Further, the support 1103 and a second cover material are preferably formed to a thicknesses of 10 µm to 200 µm. Moreover, the area of the integrated circuit 1101 is preferably 5 mm square (25 mm$^2$) or less, more preferably, 0.3 to 4 mm square (0.09 mm$^2$ to 16 mm$^2$). When the support 1103 and the cover material are made from organic resin materials, they have a strong property with respect to bending. When an integrated circuit 1101 is formed through a peeling process, it has a strong property with respect to bending compared to a single crystalline semiconductor. Since the integrated circuit, the support, and the cover material can be adhered together with no space therebetween, the completed chip including a processor circuit itself also has a strong property with respect to bending. The integrated circuit surrounded by the support and the cover material may be placed over the surface or inside of another material or embedded in a paper.

This embodiment mode can be freely combined with any of Embodiment Modes 1 to 8.

Embodiment Mode 9

As shown in Embodiment Mode 8, a semiconductor device functioning as a chip having a processing circuit (also referred to as a wireless chip, a wireless processor, a wireless memory, or a wireless tag) can be formed using the present invention. The usage of the semiconductor device of the present invention is wide-ranging. For example, the semiconductor device of the present invention can be used by being provided on paper money, coins, securities, certificates, bearer bonds, packing containers, documents, recording media, personal belongings, vehicles, foods, garments, health articles, commodities, medicines, electronic devices, or the like.

Figure 11A:
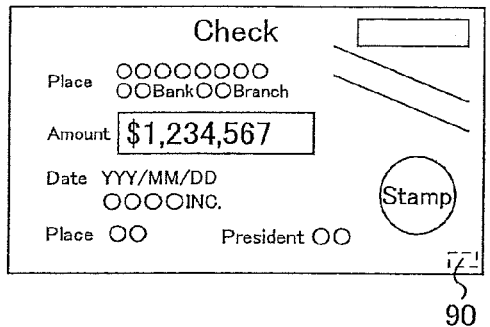
FIGS. 11A to 11G show semiconductor devices using the present invention.
Figure 11B:
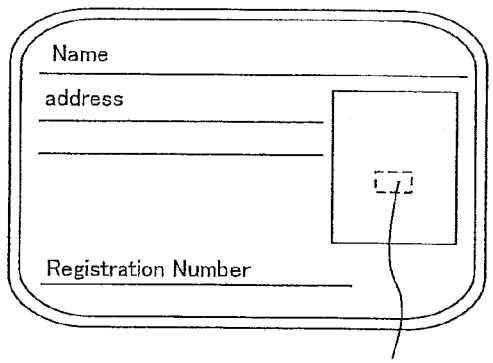
Figure 11C:
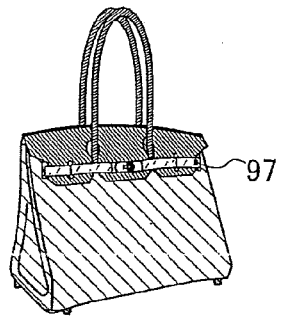
Figure 11D:
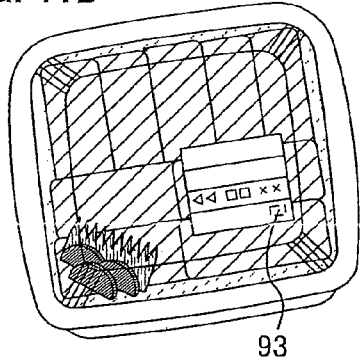
Figure 11E:
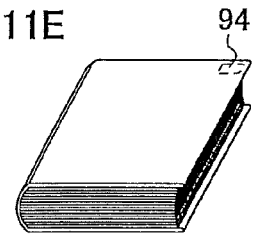
Figure 11F:
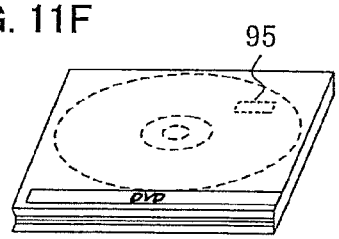
Figure 11G:
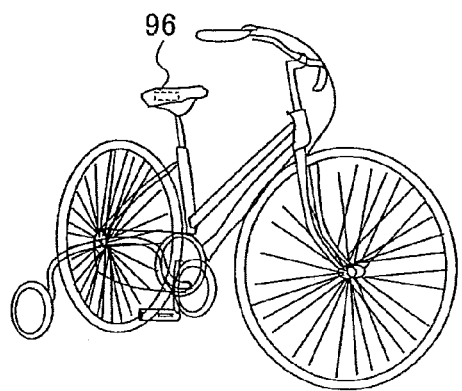

The paper money or the coins are money distributed in the market and include currency such as cash vouchers available in a certain area and memorial coins. The securities refer to checks, certificates, promissory notes, or the like, and a chip 90 having a processing circuit can be provided therein (FIG. 11A). The certificates refer to a driver's license, a certificate of residence, or the like, and a chip 91 having a processing circuit can be provided therein (FIG. 11B). The personal belongings refer to bags, glasses, or the like, and a chip 97 having a processing circuit can be provided therein (FIG. 11C). The bearer bonds refer to stamps, rice coupons, various gift certificates, or the like. The packing containers refer to wrapping paper for lunch boxes, plastic bottles, or the like, and a chip 93 having a processing circuit can be provided therein (FIG. 11D). The documents refer to books or the like, and a chip 94 having a processing circuit can be provided therein (FIG. 11E). The recording media refer to DVD software, a video tape, or the like, and a chip 95 having a processing circuit can be provided therein (FIG. 11F). The vehicles refer to wheeled vehicles such as bicycles, ships, or the like, and a chip 96 having a processing circuit can be provided therein (FIG. 11G). The foods refer to eatables, drinkables, or the like. The garments refer to clothes, footwear, or the like. The health articles refer to medical appliances, health appliances, and the like. The commodities refer to furniture, lighting equipment, or the like. The medicines refer to medical products, pesticides, or the like. The electronic devices refer to a liquid crystal display device, an EL display device, a television device (TV sets or flat-screen TV sets), a cellular phone, or the like.

Forgery can be prevented by providing a chip having a processing circuit on each of the paper money, coins, securities, certificates, bearer bonds, and the like. The efficiency of an inspection system or a system used in a rental shop can be promoted by providing a chip having a processing circuit on each of the packing containers, documents, recording media, personal belongings, foods, commodities, electronic devices, and the like. By providing a chip having a processing circuit on each of the vehicles, health articles, medicines, and the like, counterfeits or theft can be prevented; further, medicines can be prevented from being taken mistakenly. The chip having a processing circuit is provided to the foregoing articles by being attached to their surfaces or embedded thereinto. For example, in the case of a book, the chip having a processing circuit may be embedded in a piece of paper, or in the case of a package made from an organic resin, the chip having a processing circuit may be embedded in the organic resin.

When the chip having a processing circuit formed in accordance with the present invention is applied to management system or a distribution system of articles, the system can have high functionality. For example, information that is recorded in a chip having a processing circuit provided in a tag is read by a reader/writer provided near a conveyor belt, then information about a distribution process or a delivery destination is read out, and inspection of merchandise or distribution of goods can be easily carried out.

Embodiment 1

In this embodiment, an example in which a mask layer is formed using the present invention over a substrate having a surface whose wettability is controlled will be described.

Two conductive films to be processed were stacked over a substrate, and mask layers were formed thereover. The mask layers were formed to have a desired shape of conductive layers in consideration of forming the two parallel conductive layers by processing the conductive films.

Figure 15A:
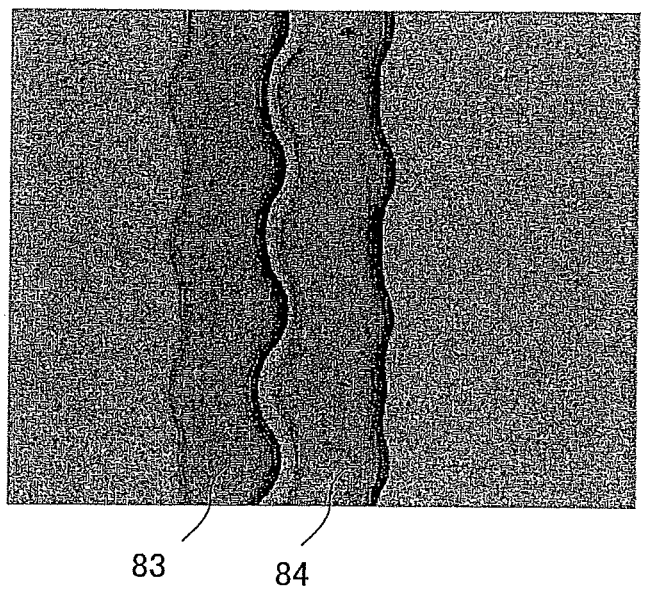
FIGS. 15A and 15B each show experiment data of a sample manufactured in Embodiment 1.

A glass substrate was used as the substrate, and a first conductive film made of TaN and a second conductive film made of W were stacked. FAS was formed over the second conductive film by a coating method, and wettability of the formation region of a mask layer is controlled. A liquid composition containing a mask layer forming material was discharged, by using a droplet discharge method, to a surface of the second conductive film where the wettability had been controlled. The substrate was heated at a temperature of 45° C. A main component of the composition containing the mask layer forming material was polyimide; surflon and ethylene glycol-n-monobutyl ether were mixed thereto as a solvent. The diameter of a droplet right after attachment of the droplet to the formation region was 70 μm. The length of the overlap of the droplets was 20 μm. FIG. 15A is an optical microscope photograph of the manufactured mask layer. As shown in FIG. 15A, mask layers 83 and 84 were formed adjacently to each other.

Figure 15B:
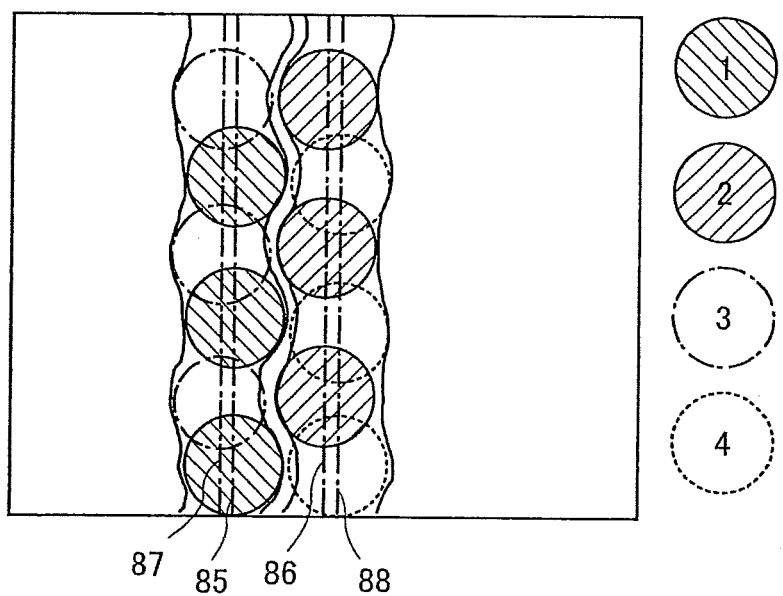

A droplet discharge method will be described in detail with reference to FIG. 15B. FIG. 15B is a schematic view showing formed mask layers and the shape of droplets right after attachment of the droplets to the formation region. The droplet discharging was mainly divided into four steps. Each droplet attached in each discharging step is shown by different circles as shown aside the schematic view. A droplet discharged in a first discharging step is represented by a circle with left diagonal lines, a droplet discharged in a second discharging step is represented by a circle with right diagonal lines, a droplet discharged in a third discharging step is represented by a circle shown with a dashed line, and a droplet discharged in a fourth discharging step is represented by a circle shown with a dotted line. A line 85 is formed by joining centers of the droplets discharged in the first discharging step. Similarly, a line 86 is formed by joining centers of the droplets discharged in the second step. Further, a line 87 is formed by joining centers of the droplets discharged in the third step. A line 88 is formed by joining centers of the droplets discharged in the fourth step.

In each step, the droplets were discharged so that the droplets to be discharged in the same step do not contact each other. In this embodiment, the distance between the droplets discharged in the same step is 100 μm. Droplets were discharged in the third and fourth steps so that the centers of the droplets are respectively positioned on the lines 87 and 88 which correspond to the centers of droplets discharged in the first step and second steps.

The continuous mask layers 83 and 84 are not formed by one-time discharging, but they are formed through two-time discharging steps. In this embodiment mode, the mask layer 83 was formed through the first and third discharging steps, and the mask layer 84 was formed through the second and fourth discharging steps. The droplets discharged in the first discharging step has the centers on the line 85 and the droplets discharged in the third discharging step has the centers on the line 87. Similarly, the droplets discharged in the second discharging step has the centers on the line 86 and the droplets discharged in the fourth discharging step has the centers on the line 88. The lines 85 and 87 which respectively connect the centers of the droplets discharged in the first and the second discharging steps has a regular distance of 15 μm therebetween. The lines 86 and 88 also have a distance of 15 μm therebetween. Thus, the centerlines of the discharged droplets are staggered; accordingly, the wave shape mask layers 83 and 84 each have continuous meandering shape on its side end.

In this embodiment, on forming mask layers adjacent to each other, first, droplets are discharged so that the centers of the droplets are positioned at lines 85 and 86, second, droplets are discharged so that the centers of the droplets are positioned at lines 87 and 88, which are positioned in places deviated from lines 85 and 86, respectively. Accordingly, the positions of the projections and depressions on the side ends having wave shape in the mask layers 83 and 84 are staggered. Thus, the mask layers 83 and 84 are formed with a spacing therebetween without contact. Consequently, it was confirmed that mask layers which are processed finely can be manufactured in this embodiment.

When such mask layers 83 and 84 are used to process the first and second conductive films, conductive layers processed into fine shapes with a short distance therebetween can be formed. Since the distance between the conductive layers can be reduced, the channel width can be reduced in the case of using the conductive layers as source and drain electrode layers. Therefore, a highly reliable semiconductor device, which can operate at high speed with high performance, can be manufactured. Since the number of faults due to defective formation is lowered in a manufacturing process, which can improve yield and increase productivity.

What is claimed:

1. A semiconductor device comprising:
a first conductive layer extending in a first direction in top view;
a semiconductor layer adjacent to the first conductive layer;
an insulating layer between the first conductive layer and the semiconductor layer;
a second conductive layer electrically connected to the semiconductor layer, the second conductive layer extending in a second direction in top view so as to intersect with the first conductive layer;
wherein the first conductive layer comprises a convex portion extending in the second direction in top view,
wherein the convex portion overlaps with the second conductive layer and the semiconductor layer, and
wherein the semiconductor layer comprises indium and oxygen.

2. The semiconductor device according to claim 1, further comprising:
a pixel electrode electrically connected to the semiconductor layer.

3. The semiconductor device according to claim 2, further comprising:
a third conductive layer electrically connected to the semiconductor layer,
wherein the pixel electrode is electrically connected to the third conductive layer.

4. The semiconductor device according to claim 2, wherein the pixel electrode is formed by a droplet discharge method.

5. The semiconductor device according to claim 1, wherein the semiconductor layer comprises zinc and gallium.

6. The semiconductor device according to claim 1,
wherein the first conductive layer comprises a gate electrode layer,
wherein the second conductive layer comprises one of a source electrode layer and a drain electrode layer.

7. The semiconductor device according to claim 1,
wherein an edge of the semiconductor layer overlaps with the second conductive layer so that the semiconductor layer extends beyond a first edge of the second conductive layer and the semiconductor layer does not extend beyond a second edge of the second conductive layer, and
wherein the first edge is an opposite edge of the second edge.

8. A semiconductor device comprising:
a first conductive layer extending in a first direction in top view;
a first semiconductor layer adjacent to the first conductive layer;
an insulating layer between the first conductive layer and the first semiconductor layer;
a second conductive layer electrically connected to the first semiconductor layer, the second conductive layer extending in a second direction in top view so as to intersect with the first conductive layer;
a second semiconductor layer adjacent to the first conductive layer;
wherein the first conductive layer comprises a first convex portion extending in the second direction in top view,
wherein the first convex portion overlaps with the second conductive layer and the first semiconductor layer,
wherein the first conductive layer comprises a second convex portion extending in the second direction in top view,
wherein the second convex portion overlaps with the second semiconductor layer, and
wherein the first semiconductor layer comprises indium and oxygen.

9. The semiconductor device according to claim 8, further comprising:
a pixel electrode electrically connected to the first semiconductor layer.

10. The semiconductor device according to claim 9, further comprising:
a third conductive layer electrically connected to the first semiconductor layer,
wherein the pixel electrode is electrically connected to the third conductive layer.

11. The semiconductor device according to claim 9, wherein the pixel electrode is formed by a droplet discharge method.

12. The semiconductor device according to claim 8, wherein the first semiconductor layer comprises zinc and gallium.

13. The semiconductor device according to claim 8, wherein the first direction is substantially perpendicular to the second direction in top view.

14. The semiconductor device according to claim 8,
wherein the first conductive layer comprises a gate electrode layer,
wherein the second conductive layer comprises one of a source electrode layer and a drain electrode layer.

15. The semiconductor device according to claim 8,
wherein an edge of the first semiconductor layer overlaps with the second conductive layer so that the first semiconductor layer extends beyond a first edge of the second conductive layer and the first semiconductor layer does not extend beyond a second edge of the second conductive layer, and
wherein the first edge is an opposite edge of the second edge.

16. A semiconductor device comprising:
a first conductive layer extending in a first direction in top view;
a semiconductor layer adjacent to the first conductive layer;
an insulating layer between the first conductive layer and the semiconductor layer;
a second conductive layer electrically connected to the semiconductor layer, the second conductive layer extending in a second direction in top view so as to intersect with the first conductive layer;
a pixel electrode electrically connected to the semiconductor layer,
wherein the first conductive layer comprises a convex portion extending in the second direction in top view,
wherein the convex portion overlaps with the second conductive layer and the semiconductor layer, wherein the semiconductor layer comprises indium, zinc and oxygen, and
wherein the pixel electrode comprises indium, zinc and oxygen.

17. The semiconductor device according to claim 16, wherein the semiconductor layer comprises gallium.

18. The semiconductor device according to claim 16, wherein the first direction is substantially perpendicular to the second direction in top view.

19. The semiconductor device according to claim 16, further comprising:
a third conductive layer electrically connected to the semiconductor layer,
wherein the pixel electrode is electrically connected to the third conductive layer.

20. The semiconductor device according to claim 16,
wherein the first conductive layer comprises a gate electrode layer,
wherein the second conductive layer comprises one of a source electrode layer and a drain electrode layer.

21. The semiconductor device according to claim 16,
wherein an edge of the semiconductor layer overlaps with the second conductive layer so that the semiconductor layer extends beyond a first edge of the second conductive layer and the semiconductor layer does not extend beyond a second edge of the second conductive layer, and
wherein the first edge is an opposite edge of the second edge.

22. The semiconductor device according to claim 16, wherein the pixel electrode is formed by a droplet discharge method.

23. A semiconductor device comprising:
a first conductive layer extending in a first direction in top view;
a semiconductor layer over the first conductive layer;
an insulating layer between the first conductive layer and the semiconductor layer;
a second conductive layer over and electrically connected to the semiconductor layer, the second conductive layer extending in a second direction in top view so as to intersect with the first conductive layer;
a third conductive layer over the semiconductor layer;
a pixel electrode electrically connected to the semiconductor layer through the third conductive layer;
a liquid crystal layer over the pixel electrode,
wherein the first conductive layer comprises a convex portion extending in the second direction in top view,
wherein the convex portion overlaps with the second conductive layer, the third conductive layer, and the semiconductor layer,
wherein the semiconductor layer comprises indium, zinc, gallium and oxygen,
wherein the insulating layer comprises a stack of a silicon nitride film and a silicon oxide film, and
wherein the pixel electrode overlaps with the third conductive layer and does not overlap with the semiconductor layer.

24. The semiconductor device according to claim 23, wherein the first direction is substantially perpendicular to the second direction in top view.

25. The semiconductor device according to claim 23,
wherein the first conductive layer comprises a gate electrode layer,
wherein the second conductive layer comprises one of a source electrode layer and a drain electrode layer.

26. The semiconductor device according to claim 23, wherein the pixel electrode is formed by a droplet discharge method.

27. A semiconductor device comprising:
a first conductive layer extending in a first direction in top view;
a semiconductor layer over the first conductive layer;
an insulating layer between the first conductive layer and the semiconductor layer;
a second conductive layer over and electrically connected to the semiconductor layer, the second conductive layer extending in a second direction in top view so as to intersect with the first conductive layer;
a third conductive layer over the semiconductor layer;
a pixel electrode electrically connected to the semiconductor layer through the third conductive layer;
a common electrode under the pixel electrode;
a liquid crystal layer over the pixel electrode and the common electrode,
wherein the first conductive layer comprises a convex portion extending in the second direction in top view,
wherein the convex portion overlaps with the second conductive layer, the third conductive layer, and the semiconductor layer,
wherein the semiconductor layer comprises indium, zinc, gallium and oxygen,
wherein the first conductive layer comprise copper,
wherein the semiconductor layer comprises a first portion overlapping with the second conductive layer, a second portion overlapping with the third conductive layer, and a depressed portion between the first portion and the second portion, and each of a thickness of the first portion and a thickness of the second portion is larger than a thickness of the depressed portion, and
wherein the insulating layer comprises a stack of a silicon nitride film and a silicon oxide film.

28. The semiconductor device according to claim 27, wherein the first direction is substantially perpendicular to the second direction in top view.

29. The semiconductor device according to claim 27,
wherein the first conductive layer comprises a gate electrode layer,
wherein the second conductive layer comprises one of a source electrode layer and a drain electrode layer.

30. The semiconductor device according to claim 27, wherein the pixel electrode is formed by a droplet discharge method.

31. A semiconductor device comprising:
a first substrate;
a first conductive layer over the first substrate, the first conductive layer extending in a first direction in top view;
a semiconductor layer over the first conductive layer;
an insulating layer between the first conductive layer and the semiconductor layer;
a second conductive layer over and electrically connected to the semiconductor layer, the second conductive layer extending in a second direction in top view so as to intersect with the first conductive layer;
a third conductive layer over the semiconductor layer;
a pixel electrode electrically connected to the semiconductor layer through the third conductive layer;
a common electrode under the pixel electrode;
a liquid crystal layer over the pixel electrode and the common electrode,
a second substrate over the liquid crystal layer;

a spacer between the first substrate and the second substrate, the spacer comprising a resin;
a flexible printed circuit over the first substrate;
a protective circuit between the flexible printed circuit and a pixel area comprising the pixel electrode, the protective circuit comprising a transistor that comprises a channel region comprising indium, zinc, gallium and oxygen,
wherein the first conductive layer comprises a convex portion extending in the second direction in top view,
wherein the convex portion overlaps with the second conductive layer, the third conductive layer, and the semiconductor layer,
wherein the semiconductor layer comprises indium, zinc, gallium and oxygen,
wherein the first conductive layer comprise copper,
wherein the semiconductor layer comprises a first portion overlapping with the second conductive layer, a second portion overlapping with the third conductive layer, and a depressed portion between the first portion and the second portion, and each of a thickness of the first portion and a thickness of the second portion is larger than a thickness of the depressed portion, and
wherein the insulating layer comprises a stack of a silicon nitride film and a silicon oxide film.

32. The semiconductor device according to claim 31, wherein the first direction is substantially perpendicular to the second direction in top view.

33. The semiconductor device according to claim 31,
wherein the first conductive layer comprises a gate electrode layer,
wherein the second conductive layer comprises one of a source electrode layer and a drain electrode layer.

34. The semiconductor device according to claim 31, wherein the pixel electrode is formed by a droplet discharge method.

* * * * *